(12) United States Patent
Lee et al.

(10) Patent No.: US 12,199,119 B2
(45) Date of Patent: Jan. 14, 2025

(54) IMAGE SENSOR

(71) Applicant: SAMSUNG ELECTRONICS CO., LTD., Suwon-si (KR)

(72) Inventors: Dongchul Lee, Hwaseong-si (KR); Jinyoung Kim, Suwon-si (KR); Beomsuk Lee, Seoul (KR); Kwansik Cho, Hwaseong-si (KR); Hochul Ji, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 514 days.

(21) Appl. No.: 17/668,524

(22) Filed: Feb. 10, 2022

(65) Prior Publication Data

US 2022/0271077 A1 Aug. 25, 2022

(30) Foreign Application Priority Data

Feb. 22, 2021 (KR) ........................ 10-2021-0023686

(51) Int. Cl.
*H01L 27/146* (2006.01)
(52) U.S. Cl.
CPC .... *H01L 27/14621* (2013.01); *H01L 27/1463* (2013.01); *H01L 27/14636* (2013.01); *H01L 27/14643* (2013.01)
(58) Field of Classification Search
CPC ....................................... H01L 27/146–14698
See application file for complete search history.

(56) References Cited

U.S. PATENT DOCUMENTS

| | | |
|---|---|---|
| 5,070,391 A | 12/1991 | Liou et al. |
| 8,178,937 B2 | 5/2012 | Hwang |
| 9,025,063 B2 | 5/2015 | Ahn et al. |
| 9,553,119 B2 | 1/2017 | Choi et al. |
| 9,609,250 B2 | 3/2017 | Lee et al. |
| 10,192,910 B2 | 1/2019 | Ihara |
| 10,199,423 B2 | 2/2019 | Ihara et al. |
| 10,777,591 B2 | 9/2020 | Hung et al. |
| 2015/0060951 A1* | 3/2015 | Hynecek ............ H01L 27/14612 257/228 |
| 2016/0056198 A1* | 2/2016 | Lee ..................... H01L 27/1463 257/225 |
| 2018/0061873 A1* | 3/2018 | Lee .................... H01L 27/14689 |
| 2020/0219912 A1* | 7/2020 | Ro ..................... H01L 27/14612 |
| 2020/0219928 A1 | 7/2020 | Park et al. |
| 2020/0227449 A1* | 7/2020 | Kim ..................... H01L 27/1463 |

* cited by examiner

*Primary Examiner* — Syed I Gheyas
*Assistant Examiner* — Casey Paul Boatman
(74) *Attorney, Agent, or Firm* — F. CHAU & ASSOCIATES, LLC

(57) ABSTRACT

An image sensor includes a semiconductor substrate having a first surface and a second surface. The first surface includes an element isolation trench. An element isolation layer is arranged inside the element isolation trench. The element isolation layer defines an active region. A gate electrode is arranged on the first surface of the semiconductor substrate. An interlayer insulating layer is arranged on the first surface of the semiconductor substrate and covers the gate electrode. A ground contact is configured to penetrate the element isolation layer and the interlayer insulating layer and contacts the semiconductor substrate. A color filter is arranged on the second surface of the semiconductor substrate.

20 Claims, 33 Drawing Sheets

A1-A1'

A2-A2'

A3-A3'

A1-A1'

A1-A1'

A1-A1'

A1-A1'

A1-A1'

A2-A2'

A1-A1'

A1-A1'

A1-A1'

A1-A1'

A1-A1'

A1-A1'

A1-A1'

A1-A1'

IMAGE SENSOR

CROSS-REFERENCE TO RELATED APPLICATION

This application claims priority under 35 U.S.C. § 119 to Korean Patent Application No. 10-2021-0023686, filed on Feb. 22, 2021 in the Korean Intellectual Property Office, the disclosure of which is incorporated by reference in its entirety herein.

1. TECHNICAL FIELD

The present inventive concept relates to an image sensor, and more particularly, to an image sensor including a photodiode.

2. DISCUSSION OF RELATED ART

Image sensors are devices that convert optical image signals to electrical signals. An image sensor includes a plurality of pixels, and each of the plurality of pixels includes a photodiode region that receives incident light and converts the received incident light to an electrical signal. Each of the plurality of pixels further includes a pixel circuit outputting a pixel signal by using charges generated in the photodiode region. As the integration level of the image sensor increases, a size of each pixel and each component of the pixel circuit decreases. Therefore, the difficulty of a process for forming the pixel circuit may increase.

SUMMARY

The present inventive concept provides an image sensor that prevents defects in a forming process of a pixel circuit.

According to an embodiment of the present inventive concept, an image sensor includes a semiconductor substrate having a first surface and a second surface. The first surface includes an element isolation trench. An element isolation layer is arranged inside the element isolation trench. The element isolation layer defines an active region. A gate electrode is arranged on the first surface of the semiconductor substrate. An interlayer insulating layer is arranged on the first surface of the semiconductor substrate and covers the gate electrode. A ground contact is configured to penetrate the element isolation layer and the interlayer insulating layer and contacts the semiconductor substrate. A color filter is arranged on the second surface of the semiconductor substrate.

According to an embodiment of the present inventive concept, an image sensor includes a semiconductor substrate having a first surface and a second surface. The semiconductor substrate includes a pixel trench extending from the first surface to an inside of the semiconductor substrate and an element isolation trench arranged in the first surface. A pixel separation structure is arranged inside the pixel trench. The pixel separation structure defines pixels in the semiconductor substrate and comprises a conductive layer. An element isolation layer is arranged inside the element isolation trench. The element isolation layer defines an active region. A p-well region is arranged in the inside of the semiconductor substrate adjacent to the first surface of the semiconductor substrate. The p-well region comprises a p-type impurity doped thereon. A gate electrode is arranged on the first surface of the semiconductor substrate. An interlayer insulating layer is arranged on the first surface of the semiconductor substrate and covers the gate electrode. A ground contact penetrates the element isolation layer and the interlayer insulating layer and is connected to the p-well region. A color filter is arranged on the second surface of the semiconductor substrate.

According to an embodiment of the present inventive concepts, an image sensor includes a semiconductor substrate having a first surface and a second surface. The semiconductor substrate includes a pixel trench extending from the first surface to the second surface and an element isolation trench arranged in the first surface of the semiconductor substrate. A pixel separation structure is arranged inside the pixel trench. The pixel separation structure defines pixels in the semiconductor substrate and comprises a conductive layer. An element isolation layer is arranged inside the element isolation trench. The element isolation layer defines an active region. A p-well region is arranged in an inside of the semiconductor substrate adjacent to the first surface of the semiconductor substrate. The p-well region comprises a p-type impurity doped thereon. A gate electrode is arranged on the first surface of the semiconductor substrate. An interlayer insulating layer is arranged on the first surface of the semiconductor substrate and covers the gate electrode. A first contact penetrates the element isolation layer and the interlayer insulating layer and is connected to the p-well region. A second contact penetrates the interlayer insulating layer and contacts the first surface of the semiconductor substrate. A third contact penetrates the interlayer insulating layer and contacts an upper surface of the gate electrode. A color filter is arranged on the second surface of the semiconductor substrate.

BRIEF DESCRIPTION OF THE DRAWINGS

Embodiments of the present inventive concept will be more clearly understood from the following detailed description taken in conjunction with the accompanying drawings in which.

DETAILED DESCRIPTION OF EMBODIMENTS

Hereinafter, embodiments of the present inventive concept are described in detail in conjunction with the accompanying drawings.

Figure 1:
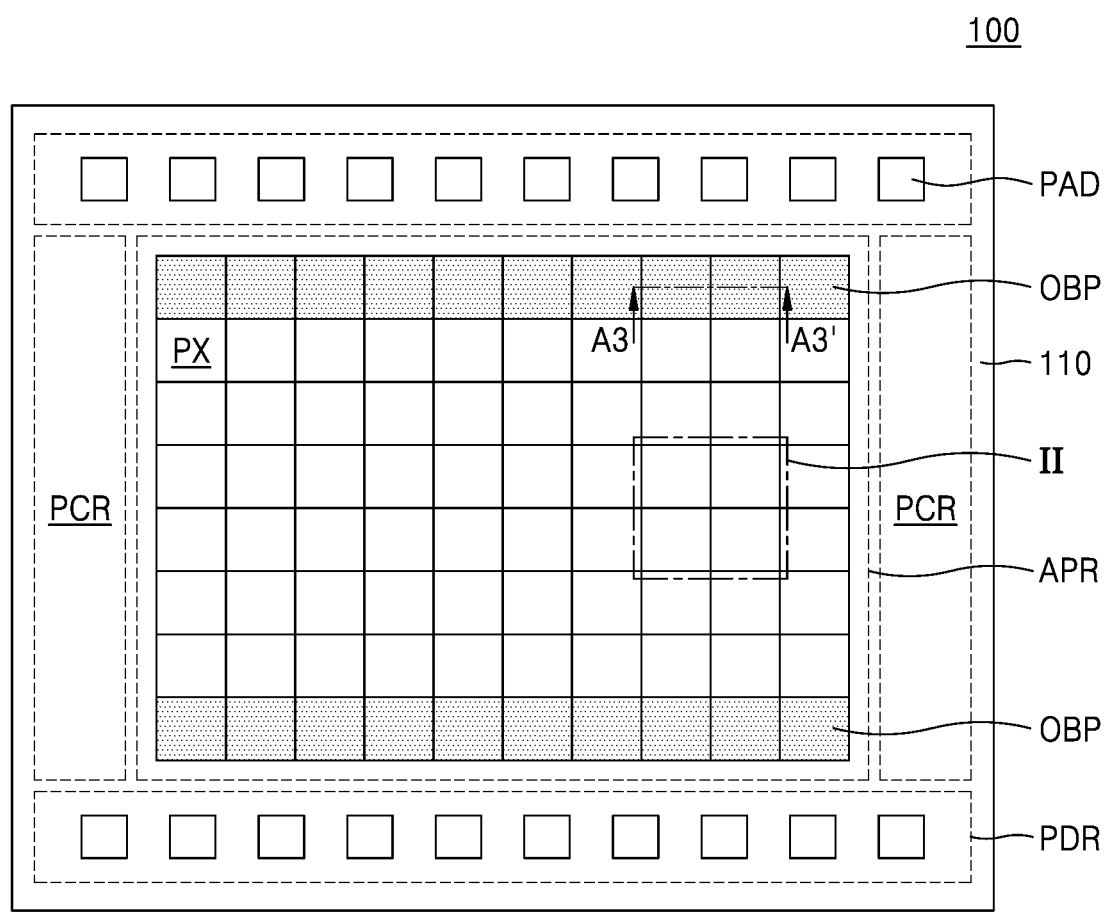
FIG. 1 is a layout diagram of an image sensor according to an embodiment of the present inventive concept.
Figure 2:
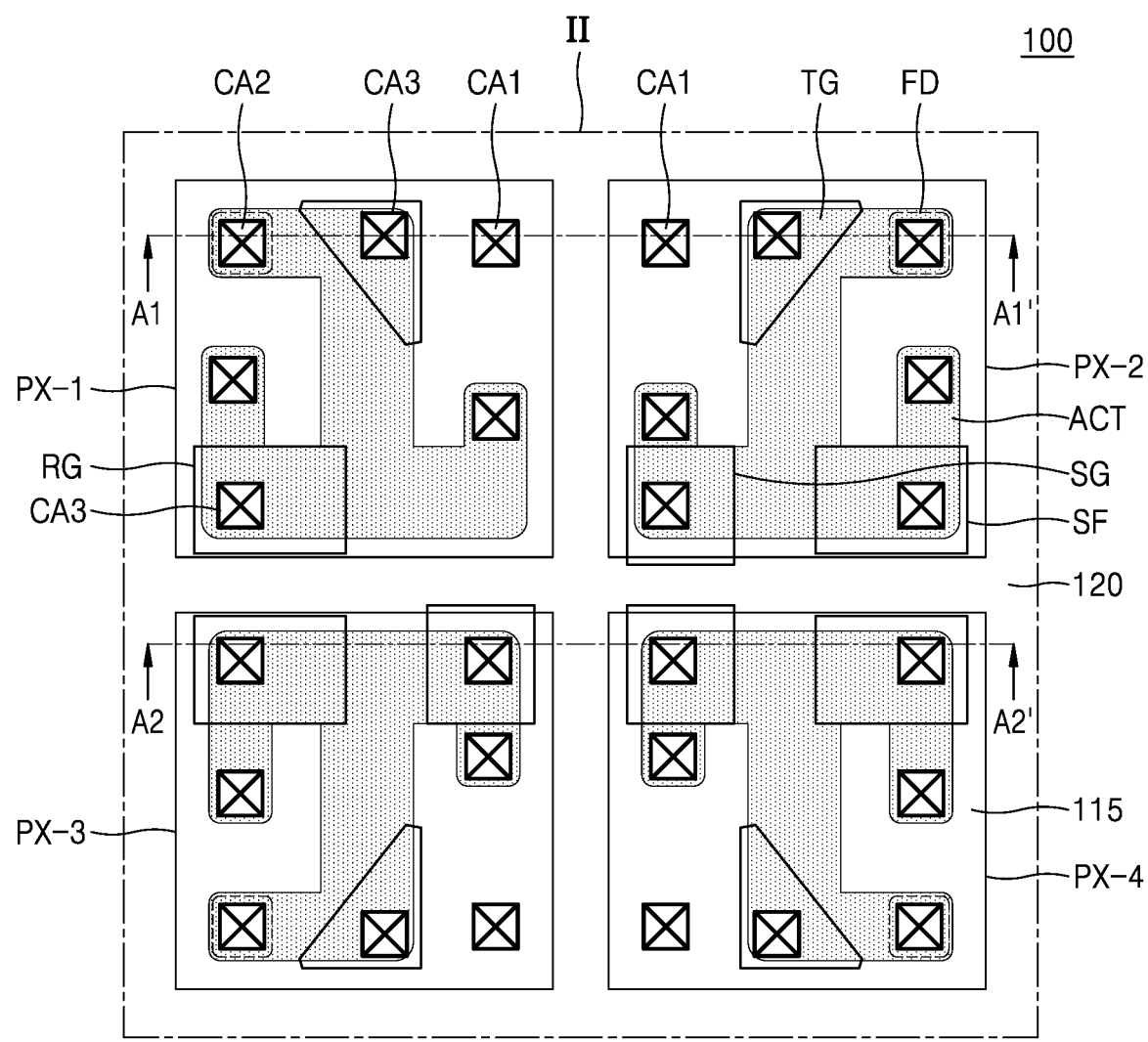
FIG. 2 is an enlarged layout of region II in FIG. 1 according to an embodiment of the present inventive concept.
Figure 3:
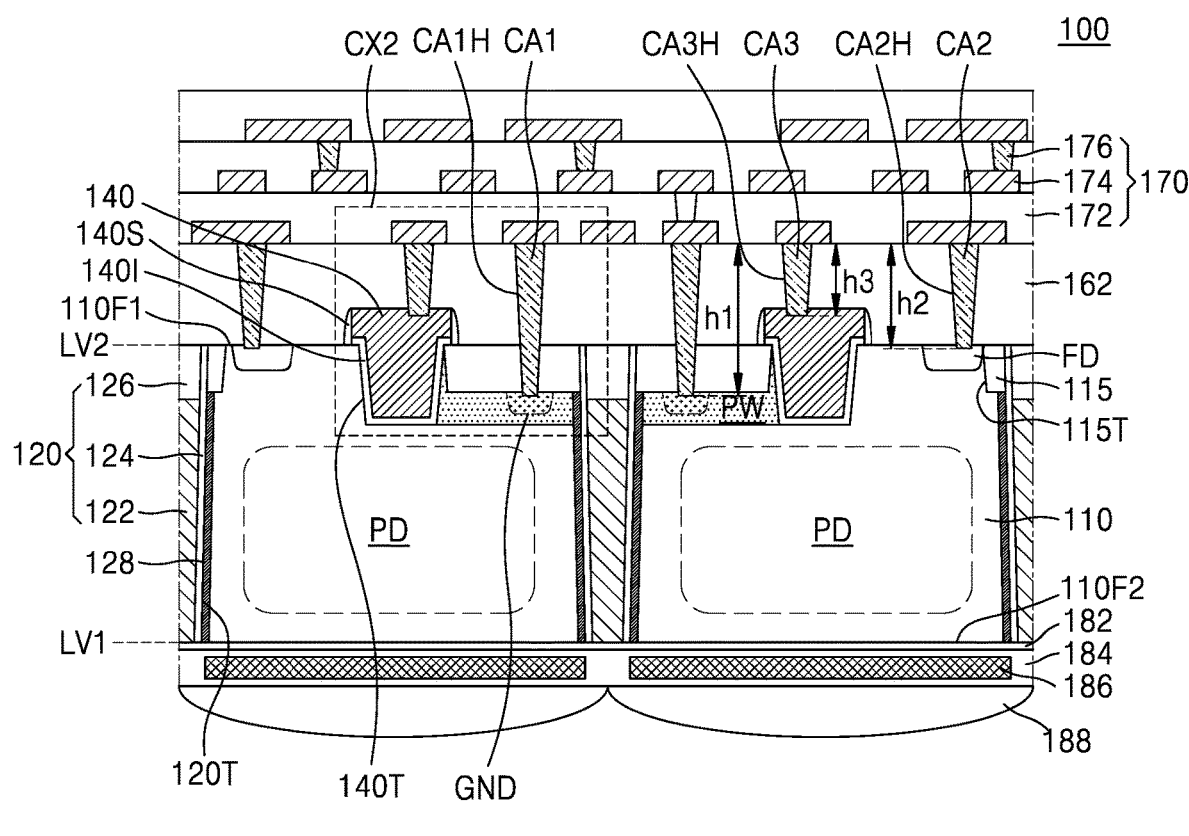
FIG. 3 is a cross-sectional view taken along line A1-A1' in FIG. 2 according to an embodiment of the present inventive concept.
Figure 4:
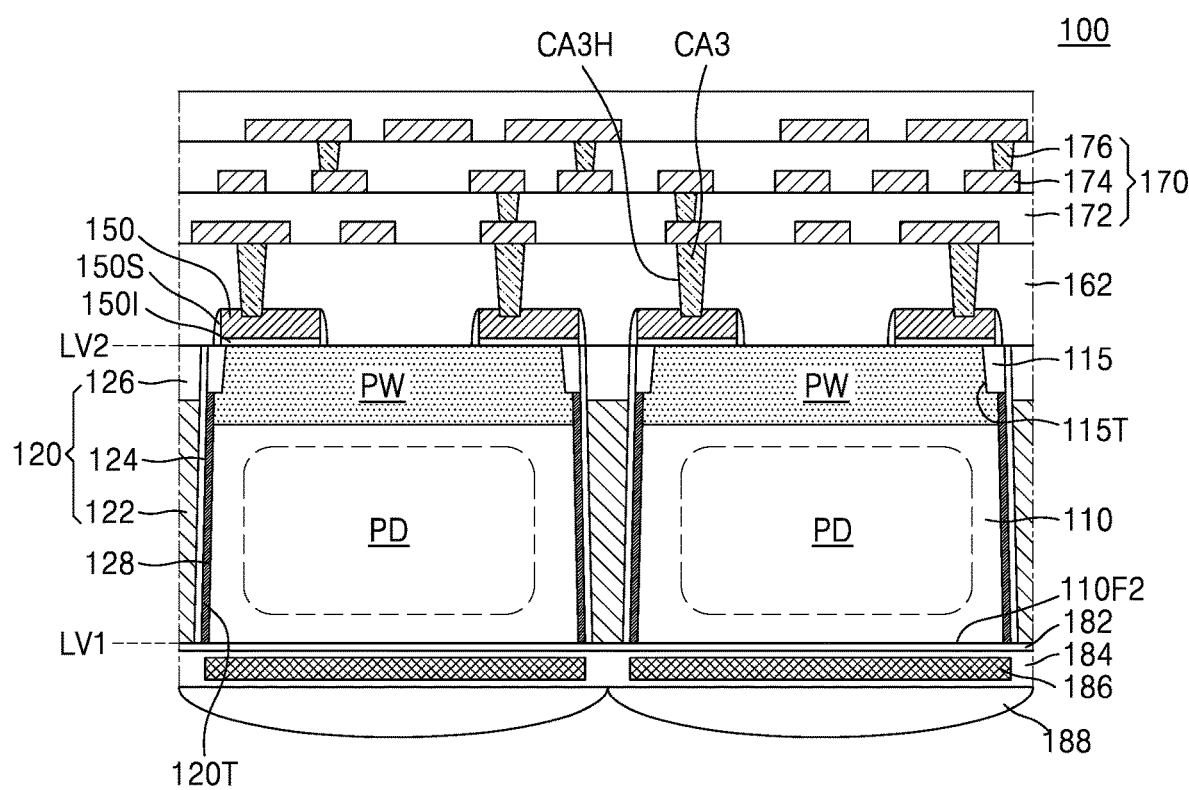
FIG. 4 is a cross-sectional view taken along line A2-A2' in FIG. 2 according to an embodiment of the present inventive concept.
Figure 5:
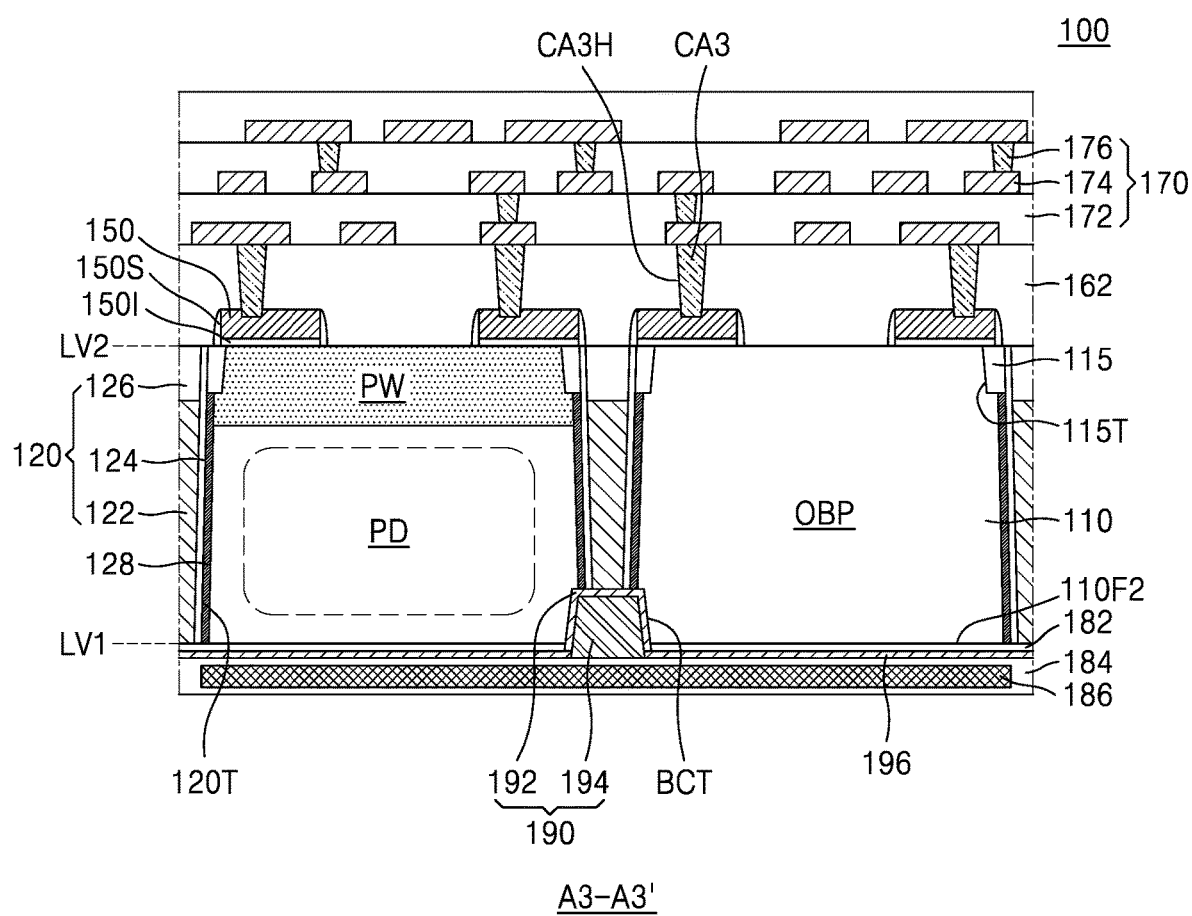
FIG. 5 is a cross-sectional view taken along line A3-A3' in FIG. 1 according to an embodiment of the present inventive concept.
Figure 6:
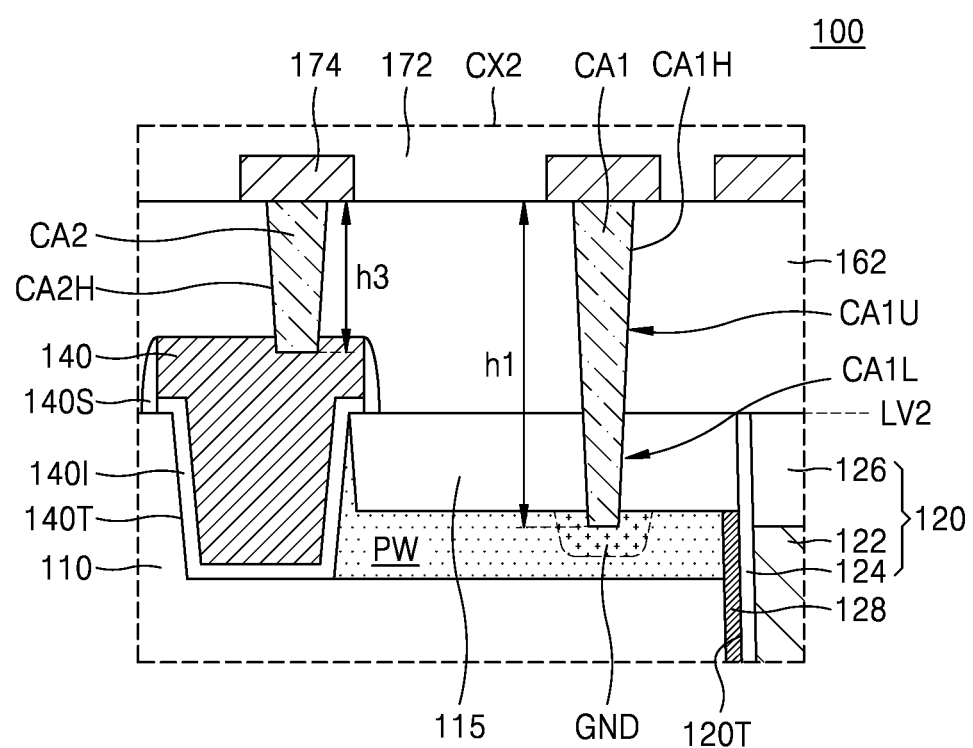
FIG. 6 is an enlarged diagram of a region CX2 in FIG. 3 according to an embodiment of the present inventive concept.

FIG. 1 is a layout diagram of an image sensor 100 according to an embodiment of the present inventive concept. FIG. 2 is an enlarged layout of a region II in FIG. 1. FIG. 3 is a cross-sectional view taken along line A1-A1' in FIG. 2, FIG. 4 is a cross-sectional view taken along line A2-A2' in FIG. 2, and FIG. 5 is a cross-sectional view taken along line A3-A3' in FIG. 1. FIG. 6 is an enlarged diagram of a region CX2 in FIG. 3.

Referring to FIGS. 1 through 6, the image sensor 100 may include an active pixel region APR, a peripheral circuit region PCR, and a pad region PDR, which are formed on a semiconductor substrate 110.

The active pixel region APR may be arranged in the central portion of the semiconductor substrate 110, and the peripheral circuit region PCR may be arranged on both sides of the active pixel region APR, such as left and right sides of the active pixel region APR in a plan view. The pad region PDR may be arranged on an edge portion of the semiconductor substrate 110, such as upper and lower edges of the semiconductor substrate 110 in a plan view.

The active pixel region APR may include a plurality of pixels PX, and a plurality of photoelectric conversion regions PD may be arranged in the plurality of pixels PX. In an embodiment, in the active pixel region APR, the plurality of pixels PX may be arranged in a matrix form of rows and columns in a first direction parallel to an upper surface of the semiconductor substrate 110, and a second direction perpendicular to the first direction and parallel to the upper surface of the semiconductor substrate 110. Some of the plurality of pixels PX may include optical black pixels OBP. For example, as shown in the embodiment of FIG. 1, the uppermost row and lowermost row of the plurality of pixels PX may include optical black pixels OBP. However, embodiments of the present inventive concept are not limited thereto. The optical black pixel OBP may operate as a reference pixel for the active pixel region APR, and perform an automatic compensation for dark current.

The peripheral circuit region PCR is illustrated in FIG. 1 as being arranged on the both sides (e.g., a left side and right side) of the active pixel region APR in a plan view. However, embodiments of the present inventive concept are not limited thereto. For example, in an embodiment, the peripheral circuit region PCR may be arranged to entirely surround the active pixel region APR in a plan view (e.g., in the first and second directions). At least one conductive pad PAD may be arranged in the pad region PDR. The conductive pad PAD may be arranged on the edge portion of the semiconductor substrate 110, such as the upper and lower edges of the semiconductor substrate 110 in the plan view.

The semiconductor substrate 110 may include a first surface 110F1 and a second surface 110F2, which are opposite to each other (e.g., in a vertical direction). In this embodiment, for convenience of explanation, a surface of the semiconductor substrate 110, on which a color filter 186 is arranged, is referred to as the second surface 110F2, and an opposite surface to the second surface 110F2 is referred to as the first surface 110F1. In addition, it is illustrated that the second surface 110F2 is on a first vertical level LV1, and the first vertical level LV1 is lower than a second vertical level LV2.

In an embodiment, the semiconductor substrate 110 may include a p-type semiconductor substrate. For example, the semiconductor substrate 110 may include a p-type silicon substrate. In an embodiment, the semiconductor substrate 110 may include a p-type bulk substrate and a p-type or an n-type epitaxial layer grown thereon. However, embodiments of the present inventive concept are not limited thereto. For example, in an embodiment, the semiconductor substrate 110 may include an n-type bulk substrate, and a p-type or an n-type epitaxial layer grown thereon. Alternatively, the semiconductor substrate 110 may include an organic plastic substrate.

The plurality of pixels PX may be arranged in a matrix form in the active pixel region APR of the semiconductor substrate 110. The plurality of photoelectric conversion regions PD may be arranged in each of the plurality of pixels PX. The photoelectric conversion region PD may include a region where an n-type impurity is doped. For example, in an embodiment, the photoelectric conversion region PD may have a potential slope due to an impurity density difference between an upper portion thereof and a lower portion thereof. However, embodiments of the present inventive concept are not limited thereto. For example, in an embodiment, the photoelectric conversion region PD may have a shape in which a plurality of impurity regions are stacked in a vertical direction. A p-well region PW may be arranged inside the semiconductor substrate 110 in a region adjacent to the first surface 110F1 of the semiconductor substrate 110. For example, the p-well region PW may be arranged adjacent to the photoelectric conversion region PD, and may include a region where a p-type impurity is doped.

An element isolation layer 115 defining an active region ACT may be formed in the first surface 110F1 of the semiconductor substrate 110. The element isolation layer 115 may be arranged in an element isolation trench 115T formed in the first surface 110F1 of the semiconductor substrate 110 and extending within a certain depth from the first surface 110F1 of the semiconductor substrate 110. In an embodiment, the element isolation layer 115 may include silicon oxide, silicon nitride, silicon oxynitride, or a combination thereof. In some embodiments, the element isolation layer 115 may include a first insulating layer conformally formed on an inner wall of the element isolation trench 115T and a second insulating layer on the first insulating layer, filling an internal space of the element isolation trench 115T.

In the active pixel region APR, a pixel separation structure 120 may be arranged in the semiconductor substrate 110, and the plurality of pixels PX may be defined by the pixel separation structure 120. In an embodiment, the pixel separation structure 120 may be arranged between one of the plurality of photoelectric conversion regions PD and the photoelectric conversion region PD adjacent thereto. The one photoelectric conversion region PD and the other photoelectric conversion region PD adjacent thereto may be physically and electrically separated from each other by the pixel separation structure 120. The pixel separation structure 120 may be arranged between each of the plurality of photoelectric conversion regions PD, which are arranged in a matrix form, and may have a grid or mesh shape in a plan view.

The pixel separation structure 120 may be formed inside a pixel trench 120T penetrating the semiconductor substrate 110 from the first surface 110F1 to the second surface 110F2 of the semiconductor substrate 110. The pixel separation structure 120 may include a conductive layer 122, an insulating liner 124, and an upper insulating layer 126.

As shown in the embodiment of FIG. 3, the insulating liner 124 may be arranged on the inside of the pixel trench 120T, and extend from the first surface 110F1 to the second surface 110F2 of the semiconductor substrate 110 (e.g., in the vertical direction). The conductive layer 122 may be surrounded by the insulating liner 124, and may fill the inside of the pixel trench 120T. The upper insulating layer 126 may be arranged inside a portion of the pixel trench 120T adjacent to the first surface 110F1 of the semiconductor substrate 110. The upper insulating layer 126 may be arranged on an upper surface of the conductive layer 122 and contact a side surface of the insulating liner 124, and fill an entrance of the pixel trench 120T.

In an embodiment, the conductive layer 122 may include at least one material selected from doped polysilicon, a metal, a metal silicide, a metal nitride, and a metal-including layer. In an embodiment, the insulating liner 124 may include metal oxide such as hafnium oxide, aluminum oxide, and tantalum oxide. In this embodiment, the insulating liner 124 may operate as a negative fixed charge layer. However, embodiments of the present inventive concept are not limited thereto. In other embodiments, the insulating liner 124 may include an insulating material such as silicon oxide, silicon nitride, and silicon oxynitride. The conductive layer 122 may include at least one material selected from doped polysilicon, a metal, a metal silicide, a metal nitride, and a metal-including layer. The upper insulating layer 126 may include an insulating material such as silicon oxide, silicon nitride, and silicon oxynitride.

A barrier impurity region 128 may be arranged around the pixel separation structure 120 inside the semiconductor substrate 110. In an embodiment, the barrier impurity region 128 may be a region where a p-type impurity is doped, and may be connected to the p-well region PW. The barrier impurity region 128 may reduce dark current due to an electron-hole pair that is generated when a surface defect is generated on a surface of the pixel trench 120T in an etching process for forming the pixel trench 120T.

On the active region ACT, transistors constituting a pixel circuit may be arranged. For example, the active region ACT may include a portion of the semiconductor substrate 110, on which a transmission gate TG, a source follower gate SF, a select gate SG, and a reset gate RG are arranged. In a portion of the active region ACT, for example, in a portion of the active region ACT adjacent to the transmission gate TG, a floating diffusion region FD may be arranged.

In some embodiments, as illustrated in FIG. 2, a first pixel PX-1, a second pixel PX-2, a third pixel PX-3, and a fourth pixel PX-4 may be arranged in a matrix form. In an embodiment, the first pixel PX-1 and the third pixel PX-3 arranged next to each other in the second direction may have a mirror symmetry shape, and the first pixel PX-1 and the second pixel PX-2 arranged next to each other in the first direction may have a mirror symmetry shape. In addition, the second pixel PX-2, the third pixel PX-3, and the fourth pixel PX-4 may include the transmission gate TG, the source follower gate SF, and the select gate SG, and the first pixel PX-1 may include the transmission gate TG and the reset gate RG. However, the illustration in FIG. 2 corresponds to a layout of transistors according to some embodiments, and the layout of the transistors or a shape of the active region ACT according to embodiments of the present inventive concept is not limited thereto.

In an embodiment, the transmission gate TG may constitute a transmission transistor TX (refer to FIG. 7), and the transmission transistor TX may be configured to transmit charges generated in the photoelectric conversion region PD to the floating diffusion region FD. The reset gate RG may constitute a reset transistor RX (refer to FIG. 7), and the reset transistor RX may be configured to periodically reset charges stored in the floating diffusion region FD. The source follower gate SF may constitute a drive transistor DX (refer to FIG. 7), and the drive transistor DX may be configured to operate as a source follower buffer amplifier and buffer a signal corresponding to charges charged in the floating diffusion region FD. The select gate SG may constitute a select transistor SX (refer to FIG. 7), and the select transistor SX may perform switching and addressing operations for selecting the pixel PX.

As illustrated in the embodiment of FIG. 3, the transmission gate TG may be referred to as a buried transmission gate electrode 140, and the buried transmission gate electrode 140 may be arranged inside a transmission gate trench 140T extending from the first surface 110F1 of the semiconductor substrate 110 to the inside of the semiconductor substrate 110. The reset gate RG, the source follower gate SF, and the select gate SG may be referred to as planar gate electrodes 150, and may be arranged on the first surface 110F1 of the semiconductor substrate 110. In an embodiment, the buried transmission gate electrode 140 and the planar gate electrode 150 may include at least one material selected from doped polysilicon, a metal, metal silicide, metal nitride, and a metal-including layer. However, embodiments of the present inventive concept are not limited thereto.

A buried transmission gate insulating layer 140I may be arranged to surround a side wall and a bottom surface of the buried transmission gate electrode 140 on an inside wall of the transmission gate trench 140T. A transmission gate spacer 140S may be arranged on the side wall of the buried transmission gate electrode 140.

As shown in the embodiment of FIG. 4, the planar gate electrode 150 may be arranged on the first surface 110F1 of the semiconductor substrate 110. A gate insulating layer 150I may be arranged between the first surface 110F1 of the semiconductor substrate 110 and the bottom surface of the planar gate electrodes 150 (e.g., in a vertical direction), and a gate spacer 150S may be arranged on the lateral side walls of the planar gate electrodes 150 and may extend to the first surface 110F1. In an embodiment, the gate spacer 150S may include the same material as a material constituting the transmission gate spacer 140S.

An interlayer insulating layer 162 may be arranged on the first surface 110F1 of the semiconductor substrate 110. The interlayer insulating layer 162 may cover the active region ACT, the element isolation layer 115, the buried transmission gate electrode 140, and the planar gate electrodes 150.

In an embodiment, the interlayer insulating layer 162 may include silicon nitride and silicon oxynitride. In some embodiments, the interlayer insulating layer 162 may be formed in a stack structure in which the first insulating layer and the second insulating layer are stacked, and the density of the first insulating layer may be different from the density of the second insulating layer. In other embodiments, the interlayer insulating layer 162 may be formed in a stack structure in which the first insulating layer and the second insulating layer are stacked, and a content of nitrogen included in the first insulating layer may be different from a content of nitrogen included in the second insulating layer. In other embodiments, an etching stop layer may be arranged between the interlayer insulating layer 162 and the first surface 110F1 of the semiconductor substrate 110, and the etching stop layer may include a material having an etch selectivity with respect to the interlayer insulating layer 162.

A ground contact CA1 may penetrate the interlayer insulating layer 162 and the element isolation layer 115, and contact the semiconductor substrate 110. For example, a bottom surface of the ground contact CA1 may directly contact the p-well region PW. For example, as illustrated in FIG. 6, a first contact hole CA1H may penetrate the interlayer insulating layer 162 and the element isolation layer 115 and expose a portion of the p-well region PW, and the ground contact CA1 may be arranged inside the first contact hole CA1H.

A ground region GND may be arranged inside the p-well region PW adjacent to the first contact hole CA1H under the element isolation layer 115. In an embodiment, the ground region GND may include a region doped with a p-type impurity at a high concentration. For example, the ground region GND may be formed by performing an ion-implantation of p-type impurity into the p-well region PW exposed via a bottom portion of the first contact hole CA1H. The ground region GND may be arranged at a lower level than a bottom surface of the element isolation layer 115. The ground region GND may be configured so that a ground voltage is applied to the p-well region PW via the ground contact CA1 and the ground region GND.

An active contact CA2 may penetrate the interlayer insulating layer 162 and contact the first surface 110F1 of the semiconductor substrate 110, such as in the active region ACT. For example, a second contact hole CA2H may penetrate the interlayer insulating layer 162 and expose the first surface 110F1 of the semiconductor substrate 110, for example, the active region ACT, and the active contact CA2 may be arranged inside the second contact hole CA2H.

A gate contact CA3 may penetrate the interlayer insulating layer 162, and contact an upper surface of the buried transmission gate electrode 140 and an upper surface of the planar gate electrodes 150. For example, a third contact hole CA3H may penetrate the interlayer insulating layer 162 and expose the upper surface of the buried transmission gate electrode 140 and the upper surface of the planar gate electrodes 150, and the gate contact CA3 may be arranged inside the third contact hole CA3H.

In an embodiment, the ground contact CA1 may have a first height h1 in a third direction perpendicular to the first surface 110F1 of the semiconductor substrate 110 and parallel to a vertical direction. For example, the first height h1 may be in a range of about 100 nm to about 600 nm. However, embodiments of the present inventive concept are not limited thereto. The active contact CA2 may have a second height h2 that is less than the first height h1 in the third direction. The gate contact CA3 may have a third height h3 that is less than the first height h1 in the third direction. For example, in an embodiment, the gate contact CA3 may have a third height h3 that is less than the second height h2 in the third direction.

The ground contact CA1 may include a bottom surface arranged at a lower level than a second vertical level LV2 of the first surface 110F1 of the semiconductor substrate 110. In addition, a bottom surface of the ground contact CA1 may be arranged at a lower level than a bottom surface of the active contact CA2 or the bottom surface of the element isolation layer 115. For example, the bottom surface of the ground contact CA1 may extend closer to the second surface 110F2 of the semiconductor substrate 110 than the bottom surfaces of the active contact CA2 and/or the element isolation layer 115. For example, as shown in the embodiment of FIG. 6, when the ground contact CA1 penetrates the interlayer insulating layer 162 and the element isolation layer 115, an upper side wall CA1U of the ground contact CA1 may be covered by the interlayer insulating layer 162, and a lower side wall CA1L of the ground contact CA1 may be covered by the element isolation layer 115.

In an embodiment, the ground contact CA1, the active contact CA2, and the gate contact CA3 may include a conductive barrier layer and a contact metal layer. For example, the ground contact CA1, the active contact CA2, and the gate contact CA3 may include at least one compound selected from copper (Cu), aluminum (Al), tungsten (W), titanium (Ti), titanium nitride (TiN), tantalum (Ta), tantalum nitride (TaN), ruthenium (Ru), and tungsten nitride (WN).

An upper wiring structure 170 may be arranged on the interlayer insulating layer 162. In an embodiment, the upper wiring structure 170 may be formed in a stack structure of a plurality of layers. The upper wiring structure 170 may include an insulating layer 172, a wiring layer 174, and a via contact 176. In an embodiment, the insulating layer 172 may include an insulating material such as silicon oxide, silicon nitride, and silicon oxynitride. The wiring layer 174 and the via contact 176 may include at least one of impurity-doped or undoped polysilicon, a metal, a metal silicide, a metal nitride, and a metal-including layer. For example, the wiring layer 174 and the via contact 176 may include W, Al, Cu, WSi, TiS, WN, TiN, doped polysilicon, etc. However, embodiments of the present inventive concept are not limited thereto.

A back side insulating layer 182 may be arranged on the second surface 110F2 of the semiconductor substrate 110. In an embodiment, the back side insulating layer 182 may be arranged substantially on the entire area of the second surface 110F2 of the semiconductor substrate 110, and may contact a lower surface of the pixel separation structure 120 arranged at the same level as the second surface 110F2 of the semiconductor substrate 110. In an embodiment, the back side insulating layer 182 may include a metal oxide such as hafnium oxide, aluminum oxide, and tantalum oxide. In other embodiments, the back side insulating layer 182 may include an insulating material such as silicon oxide, silicon nitride, and a low-k dielectric material. However, embodiments of the present inventive concept are not limited thereto.

A passivation layer 184 may be arranged on the back side insulating layer 182, and a color filter 186 and a microlens 188 may be arranged on the passivation layer 184. In an embodiment, a support substrate may be further arranged on the first surface 110F1 of the semiconductor substrate 110.

As shown in the embodiment of FIG. 5, a back side contact structure 190 electrically connected to the pixel separation structure 120 on the second surface 110F2 of the semiconductor substrate 110 may be formed. A negative bias may be applied to the conductive layer 122 of the pixel separation structure 120 via the back side contact structure 190.

As illustrated in the embodiment of FIG. 5, the back side contact structure 190 may include a barrier conductive layer 192 and a buried conductive layer 194, which are arranged inside a back side contact hole BCT formed in the second surface 110F2 of the semiconductor substrate 110. The back side contact hole BCT may be formed in the second surface 110F2 of the semiconductor substrate 110 to be in communication with the pixel trench 120T. In an embodiment, the barrier conductive layer 192 may be formed with a certain thickness inside the back side contact hole BCT, and the buried conductive layer 194 may fill the inside of the back side contact hole BCT on the barrier conductive layer 192. In some embodiments, the back side contact hole BCT may be arranged inside the optical black pixel OBP. In other embodiments, the back side contact hole BCT may be arranged not only in the optical black pixel OBP but in some pixels PX of the active pixel region APR.

In an embodiment, the barrier conductive layer 192 may include at least one metal material selected from W, Al, Ti, Ru, cobalt (Co), nickel (Ni), Cu, gold (Au), silver (Ag), and platinum (Pt), and the buried conductive layer 194 may include at least one metal material selected from W, Al, Ti, Ru, Co, Ni, Cu, Au, Ag, and Pt. However, embodiments of the present inventive concept are not limited thereto.

As illustrated in FIG. 5, a light shield layer 196 may be arranged on the optical black pixel OBP. In an embodiment, the light shield layer 196 may include at least one metal material selected from W, Al, Ti, Ru, Co, Ni, Co, Au, Ag, and Pt. In some embodiments, the light shield layer 196 may include the same material as the barrier conductive layer 192 of the back side contact structure 190, and for example, may be formed integrally with the barrier conductive layer 192. However, embodiments of the present inventive concept are not limited thereto. The photoelectric conversion region PD may be arranged inside a portion of the optical black pixel OBP, but may not be arranged inside the remaining portion of the optical black pixel OBP.

In an embodiment, the optical black pixel OBP may function as a reference pixel for the active pixel region APR, and perform an automatic compensation operation for dark current. For example, the light shield layer 196 may block light from being incident to a reference pixel in the optical black pixel OBP. By measuring a reference charge amount generated by the reference pixel where light is blocked, and comparing the measured charge amount to a sensed charge amount generated in the active pixel region APR, an optical signal input from the active pixel region APR may be calculated from a difference between the sensed charge amount and the reference charge amount.

In general, in a comparative embodiment, a ground region may be formed to be surrounded by the element isolation layer 115 at the same level as the first surface 110F1 of the semiconductor substrate 110, and the ground region may be arranged apart from the active region ACT in the horizontal direction with the element isolation layer 15 therebetween. In a patterning process for forming the element isolation layer 115 having such shape, it may be necessary to form a mask pattern corresponding to the active region ACT and a mask pattern corresponding to the ground region. However, there may be an issue that a lifting defect occurs in the patterning process because a size of the mask pattern corresponding to the ground region is less than a size of the mask pattern corresponding to the active region ACT. When the mask pattern corresponding to the ground region is formed relatively large to prevent the lifting defect, an area occupied by the ground region may be increased and may limit pixel miniaturization.

However, according to the above-described embodiments of the present inventive concept, the ground region GND may be formed inside the p-well region PW under the element isolation layer 115, and the ground contact CA1 may be arranged to penetrate the element isolation layer 115 and be connected to the ground region GND. Accordingly, a mask pattern corresponding to a ground region may not need to be formed, and thus, a lifting defect of a mask pattern may be prevented. In addition, when the ground region GND is arranged under the element isolation layer 115, an area of the ground region GND may be reduced, and the pixel PX of the image sensor 100 may have a compact size and pixel miniaturization may be increased.

Figure 7:
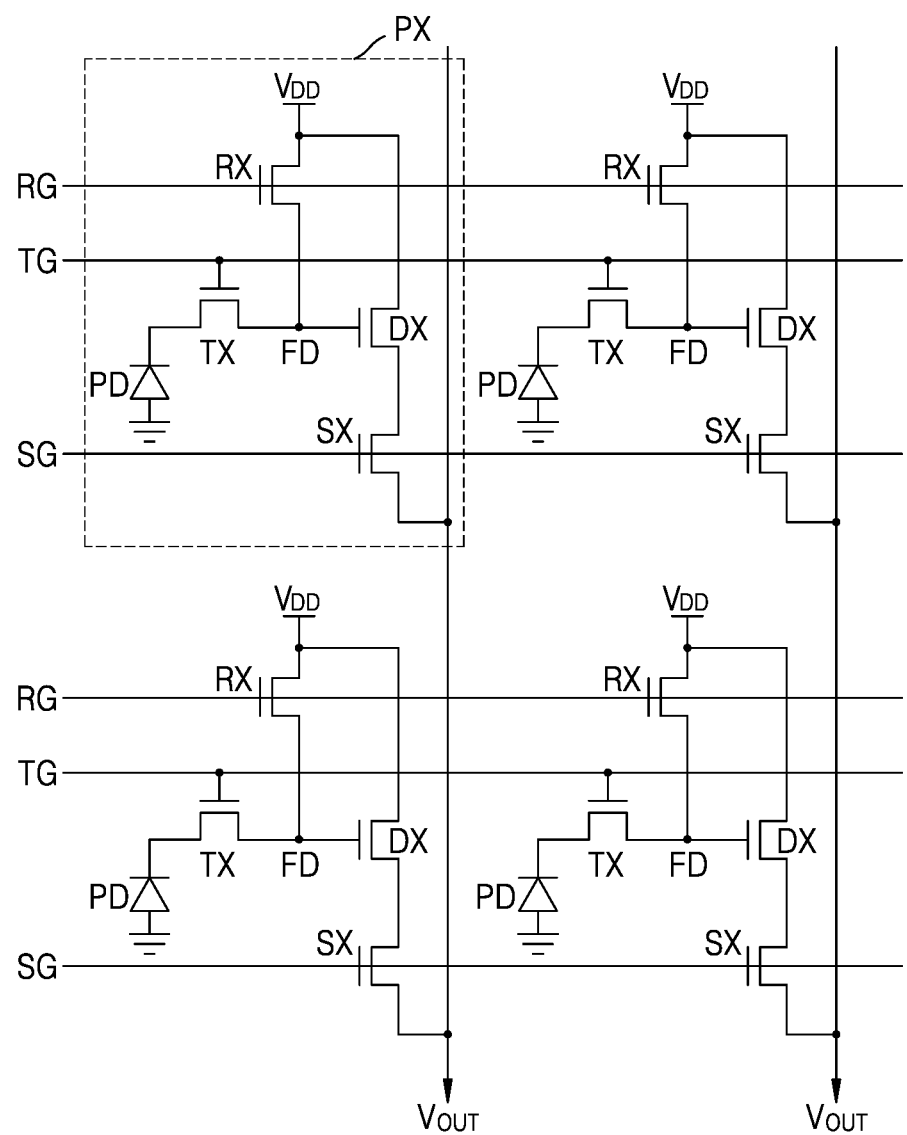
FIG. 7 is an equivalent circuit diagram of a pixel of an image sensor, according to an embodiment of the present inventive concept.

FIG. 7 is an equivalent circuit diagram of the pixel PX of the image sensor 100, according to an embodiment of the present inventive concept.

Referring to FIG. 7, the plurality of pixels PX may be arranged in a matrix form. Each of the plurality of pixels PX may include a transmission transistor TX and logic transistors. In this embodiment, the logic transistors may include a reset transistor RX, a select transistor SX, and a drive transistor DX (or a source follower transistor). The reset transistor RX may include the reset gate RG, the select transistor SX may include the select gate SG, the drive transistor DX may include the source follower gate SF, and the transmission transistor TX may include the transmission gate TG.

Each of the plurality of pixels PX may further include the photoelectric conversion region PD and the floating diffusion region FD. The photoelectric conversion region PD may correspond to the photoelectric conversion region PD described with reference to the embodiments of FIGS. 1 through 6. In an embodiment, the photoelectric conversion region PD may generate and accumulate photocharges in proportion to an amount of incident light from the outside, and may use a photodiode, a photo transistor, a photo gate, a pinned photodiode (PPD), and a combination thereof.

The transfer gate TG may transmit charges generated in the photoelectric conversion region PD to the floating diffusion region FD. The floating diffusion region FD may receive charges generated in the photoelectric conversion region PD and accumulatively store the received charges. The drive transistor DX may be controlled according to an amount of photo charges accumulated in the floating diffusion region FD.

The reset transistor RX may periodically reset the charges accumulated in the floating diffusion region FD. A drain electrode of the reset transistor RX may be connected to the floating diffusion region FD, and a source electrode thereof may be connected to the power voltage $V_{DD}$. When the reset transistor RX is turned on, the power voltage $V_{DD}$ connected to the source electrode of the reset transistor RX may be transmitted to the floating diffusion region FD. When the reset transistor RX is turned on, the charges accumulated in the floating diffusion region FD may be discharged, and the floating diffusion region FD may be reset.

In an embodiment, the drive transistor DX may be connected to a current source arranged outside the plurality of pixels PX, function as a source follower buffer amplifier, amplify a potential change in the floating diffusion region FD, and output the amplified potential change as an output voltage $V_{OUT}$.

The select transistor SX may select the plurality of pixels PX in units of rows, and when the select transistor SX is turned on, the power voltage $V_{DD}$ may be transferred to the source electrode of the drive transistor DX.

Figure 8:
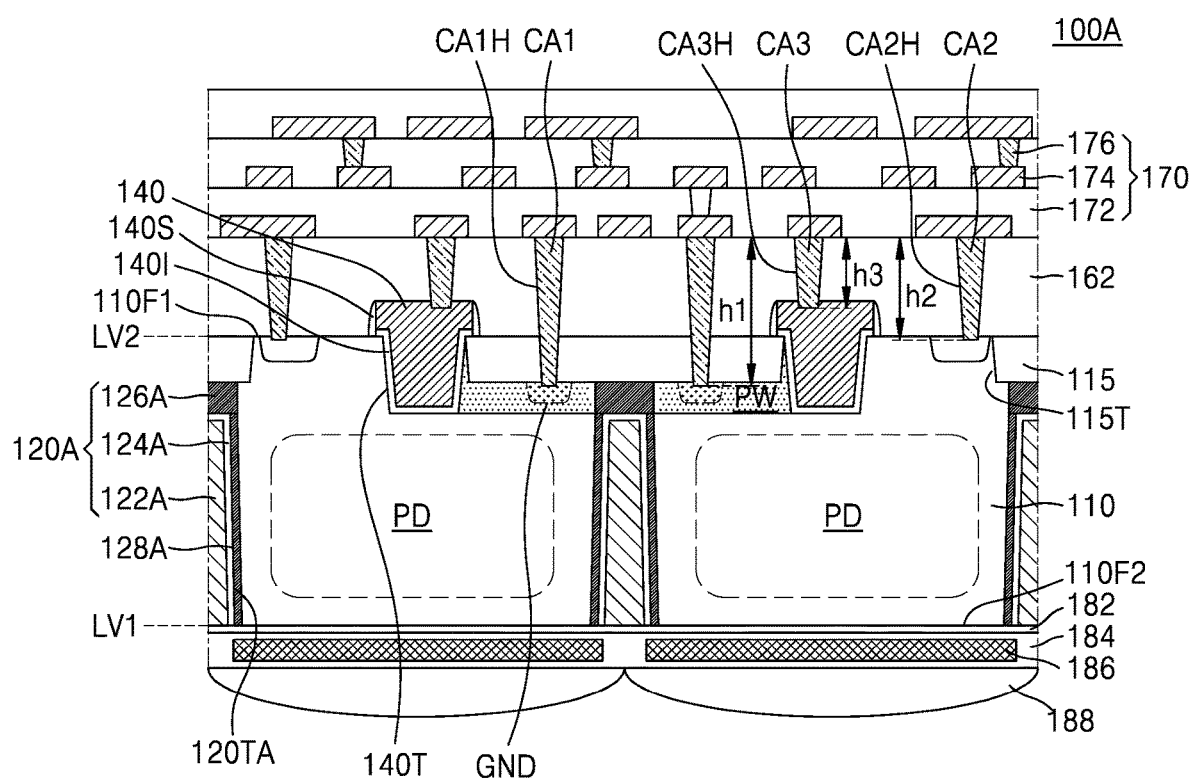
FIG. 8 is a cross-sectional view of an image sensor according to an embodiment of the present inventive concept.

FIG. 8 is a cross-sectional view of an image sensor 100A according to an embodiment. In FIG. 8, the same reference numerals as those in FIGS. 1 through 7 may denote the same components and a repeated description may be omitted for convenience of explanation.

Referring to FIG. 8, a pixel separation structure 120A may include a conductive layer 122A, an insulating liner 124A, an impurity region 126A, and a barrier impurity region 128A. The pixel separation structure 120A may include a separation structure of a backside deep trench isolation type.

A pixel trench 120TA may extend from the second surface 110F2 toward the first surface 110F1 of the semiconductor substrate 110, but may not be connected to the first surface 110F1 of the semiconductor substrate 110. For example, the pixel trench 120TA may extend to an inside of the semiconductor substrate 110 but may not fully penetrate the semiconductor substrate 110.

The insulating liner 124A may be arranged on an inner wall of the pixel trench 120TA and an upper surface of the pixel trench 120TA, and the conductive layer 122A may fill the internal space of the pixel trench 120TA. The impurity region 126A may be arranged between a first end portion of the pixel trench 120TA adjacent to the first surface 110F1 of the semiconductor substrate 110 and the element isolation layer 115. The impurity region 126A may include a region where an n-type impurity is doped.

The first contact hole CA1H may penetrate the interlayer insulating layer 162 and the element isolation layer 115 and extend to the p-well region PW, and the ground contact CA1 may be arranged inside the first contact hole CA1H.

Figure 9:
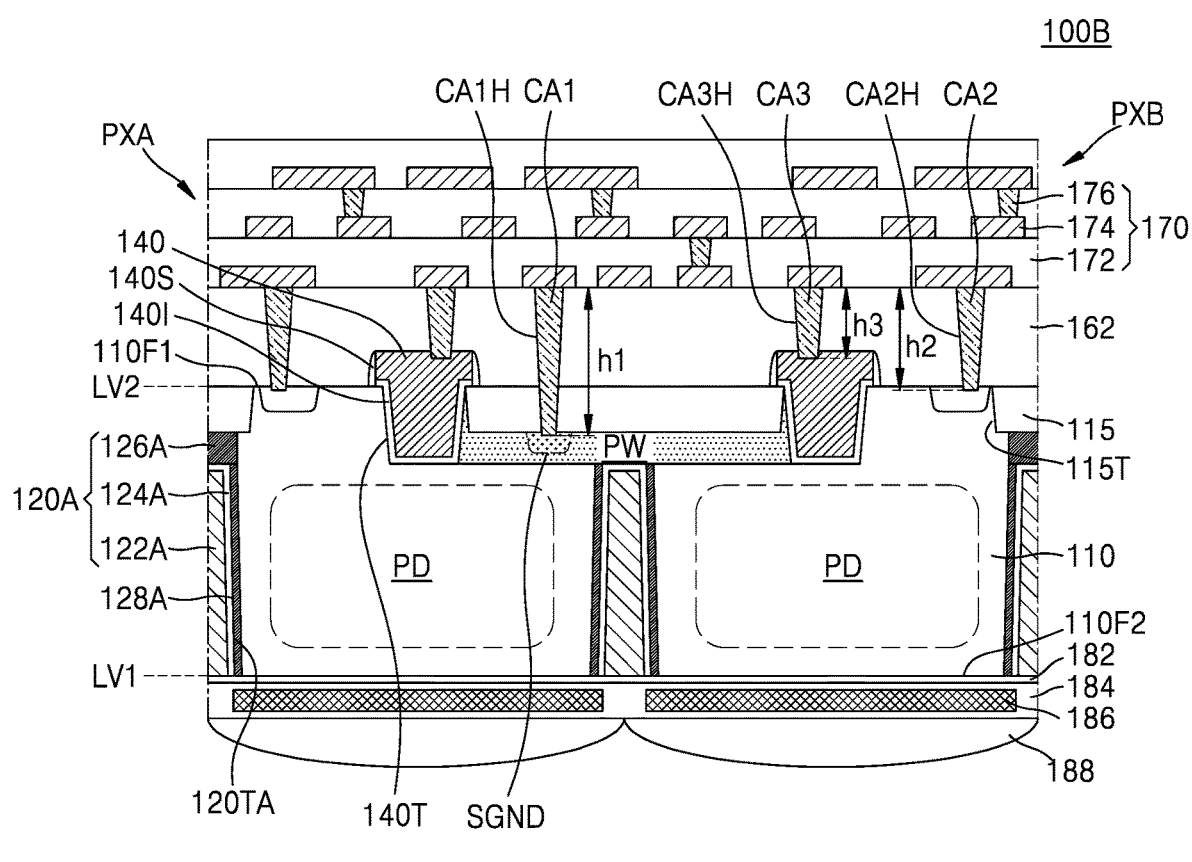
FIG. 9 is a cross-sectional view of an image sensor taken along line A1-A1' in FIG. 2 according to an embodiment of the present inventive concept.

FIG. 9 is a cross-sectional view of an image sensor 100B according to an embodiment. In FIG. 9, the same reference numerals as those in FIGS. 1 through 8 may denote the same components and a repeated description will be omitted for convenience of explanation.

Referring to FIG. 9, the image sensor 100B may include a pixel including a share-type ground region SGND. For example, a first pixel PXA and a second pixel PXB may be arranged in parallel with each other, and the p-well region PW of the first pixel PXA and the p-well region PW of the second pixel PXB may be interconnected to each other. The share-type ground region SGND may be formed in the p-well region PW of the first pixel PXA, and the ground contact CA1 may be arranged to be connected to the share-type ground region SGND in the first pixel PXA. Since the first pixel PXA and the second pixel PXB have a structure in which the share-type ground region SGND is shared, the ground contact CA1 may not be formed in the second pixel PXB. However, embodiments of the present inventive concept are not limited thereto. For example, in an embodiment, the ground contact CA1 may be formed in the second pixel PXB and may not be formed in the first pixel PXA.

Figure 10:
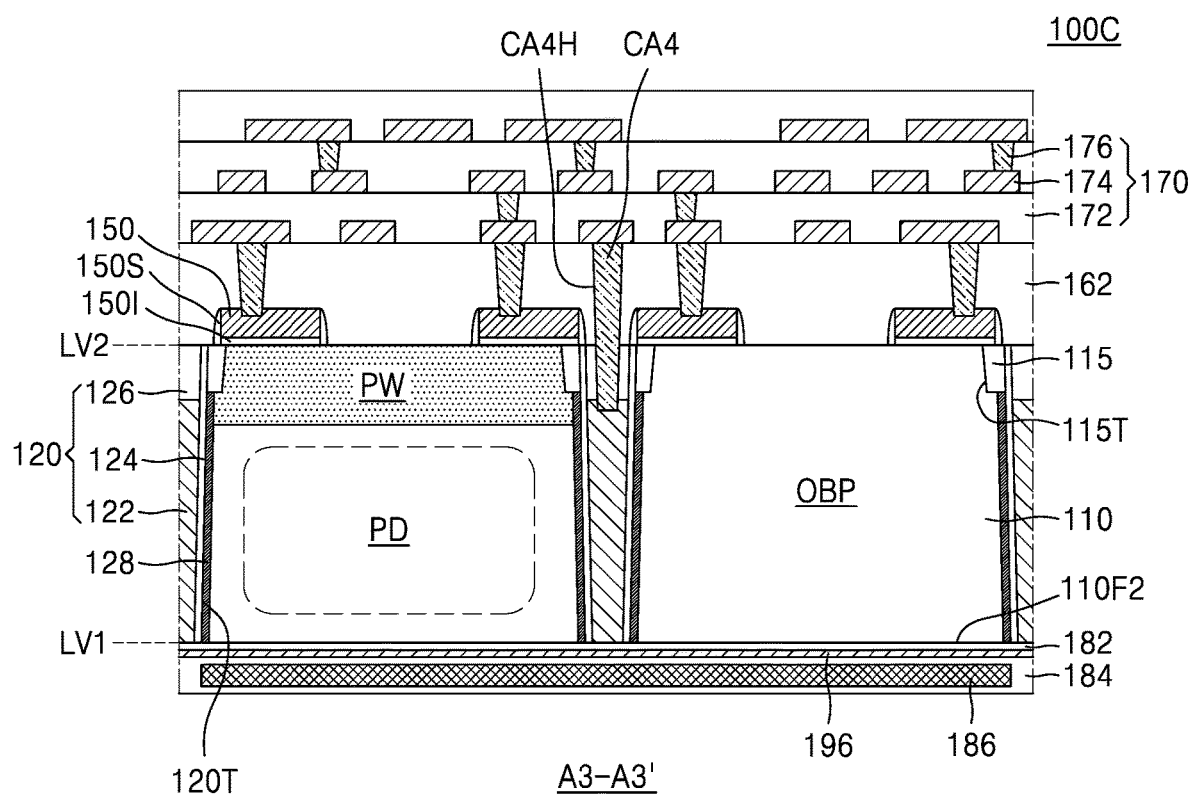
FIG. 10 is a cross-sectional view of an image sensor taken along line A3-A3' in FIG. 1 according to an embodiment of the present inventive concept.

FIG. 10 is a cross-sectional view of an image sensor 100C according to an embodiment of the present inventive concept. FIG. 10 is a cross-sectional view corresponding to a cross-section taken along line A3'A3' in FIG. 1. In FIG. 10, the same reference numerals as those in FIGS. 1 through 9 may denote the same components and a repeated description may be omitted for convenience of explanation.

Referring to FIG. 10, the back side contact structure 190 illustrated in FIG. 5 may be omitted, and a bias contact CA4 may be arranged on the first surface 110F1 of the semiconductor substrate 110 instead of the back side contact structure 190. A fourth contact hole CA4H may be arranged to penetrate the interlayer insulating layer 162 and the upper insulating layer 126, and the bias contact CA4 may be arranged inside the fourth contact hole CA4H and may extend to an upper portion of the conductive layer 122 of the pixel separation structure 120. A negative bias may be applied to the conductive layer 122 of the pixel separation structure 120 via the bias contact CA4.

Figure 11:
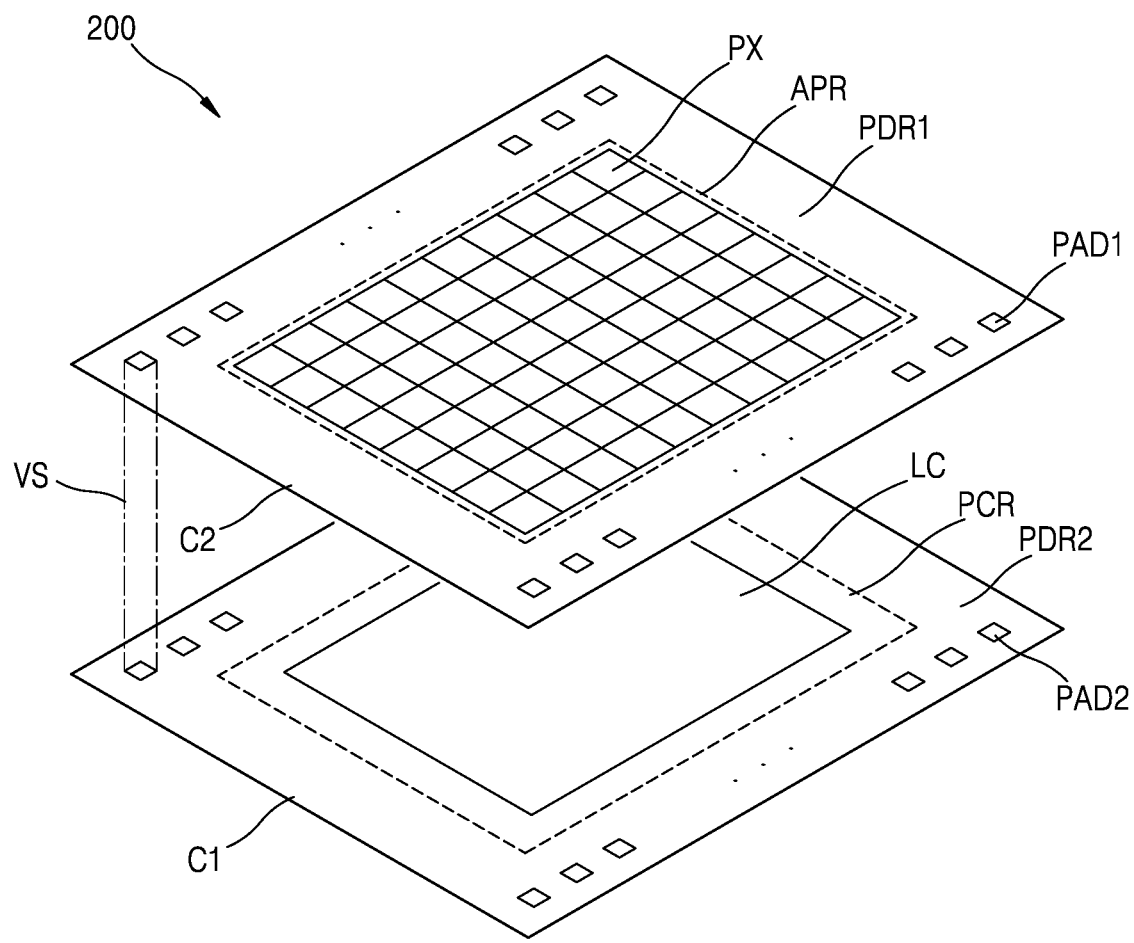
FIG. 11 is an exploded perspective view of an image sensor according to an embodiment of the present inventive concept.

FIG. 11 is a schematic diagram of an image sensor 200 according to an embodiment of the present inventive concept.

Referring to the embodiment of FIG. 11, the image sensor 200 may include a stack-type image sensor including a first chip C1 and a second chip C2, which are stacked in the vertical direction. The first chip C1 may include the active pixel region APR and a first pad region PDR1, and the second chip C2 may include the peripheral circuit region PCR and a second pad region PDR2.

The plurality of first pads PAD1 of the first pad region PDR1 may be configured to transmit/receive an electrical signal with an external device, etc. In an embodiment, the peripheral circuit region PCR may include a logic circuit block LC and a plurality of complementary metal-oxide semiconductor (CMOS) transistors. The peripheral circuit region PCR may provide a constant signal to each pixel PX of the active pixel region APR, or control the output signal from each pixel PX. A first pad PAD1 in the first pad region PDR1 may be electrically connected to a second pad PAD2 in the second pad region PDR2 through a via structure VS.

FIGS. 12 through 16, 17A, 17B, 18, 19, 20A, 20B, and 21 through 28 are cross-sectional views illustrating a manufacturing method of the image sensor 100, according to embodiments of the present inventive concept. For example, FIGS. 12 through 16, 17A, 18, 19, 20A, and 21 through 28 are cross-sectional views corresponding to cross-sections taken along line A1'A1' in FIG. 2, and FIGS. 17B and 20B are cross-sectional views corresponding to cross-sections taken along line A2'A2' in FIG. 2.

Figure 12:
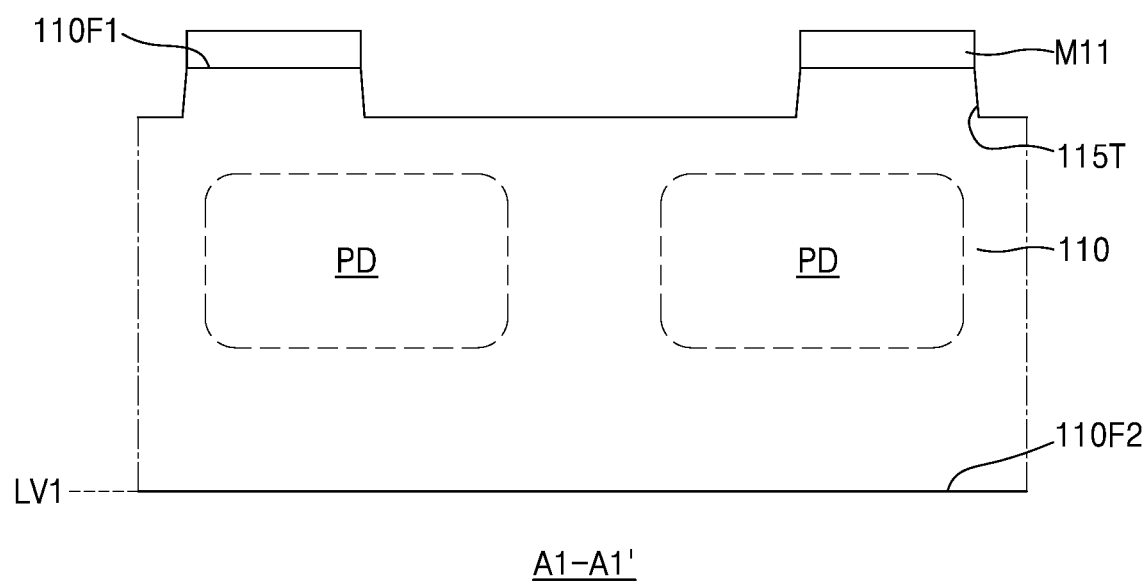
FIGS. 12 through 16, 17A, 18, 19, 20A and 21 through 28 are cross-sectional views illustrating a manufacturing method of an image sensor taken along line A1-A1' in FIG. 2 according to embodiments of the present inventive concept.

Referring to FIG. 12, the semiconductor substrate 110 having the first surface 110F1 and the second surface 110F2, which are opposite to each other (e.g., in the vertical direction), may be prepared. The second surface 110F2 may be arranged at the first vertical level LV1, and the first surface 110F1 may be arranged at the second vertical level LV2.

In an embodiment, the photoelectric conversion region PD may be formed by an ion implantation process from the first surface 110F1 of the semiconductor substrate 110. For example, the photoelectric conversion region PD may be formed by doping n-type impurity. However, embodiments of the present inventive concept are not limited thereto.

Thereafter, a first mask pattern M11 may be formed on the first surface 110F1 of the semiconductor substrate 110, and the element isolation trench 115T may be formed in the semiconductor substrate 110 by using the first mask pattern M11 as an etch mask.

In an embodiment, the element isolation trench 115T may be formed to have a height in a range of about 100 nm to about 500 nm in the third direction perpendicular to the first surface 110F1. However, embodiments of the present inventive concept are not limited thereto.

In an embodiment, only one first mask pattern M11 may be arranged in a region of the first surface 110F1 corresponding to one pixel PX. For example, the first mask pattern M11 may have a planar shape corresponding to a planar shape of the active region ACT (refer to FIG. 2).

According to a manufacturing method of an image sensor according to a comparative embodiment, a mask pattern corresponding to a planar shape of the active region ACT in the region of the first surface 110F1 corresponding to one pixel PX and a mask pattern corresponding to the planar shape of the ground region may be arranged to be spaced apart from each other. There may be an issue that a lifting defect occurs in the patterning process because a size of the mask pattern corresponding to the ground region is less than a size of the mask pattern corresponding to the active region ACT. When the mask pattern corresponding to the ground region is formed relatively large to prevent the lifting defect, an area occupied by the ground region may be increased and may limit pixel miniaturization.

However, according to an embodiment of the present inventive concept, only one first mask pattern M11 corresponding to the planar shape of the active region ACT (refer to FIG. 2) may be arranged in the region of the first surface 110F1 corresponding to one pixel PX, and the mask pattern corresponding to the ground region may not be formed. Accordingly, a lifting defect of a mask pattern corresponding to a ground region may be prevented.

Figure 13:
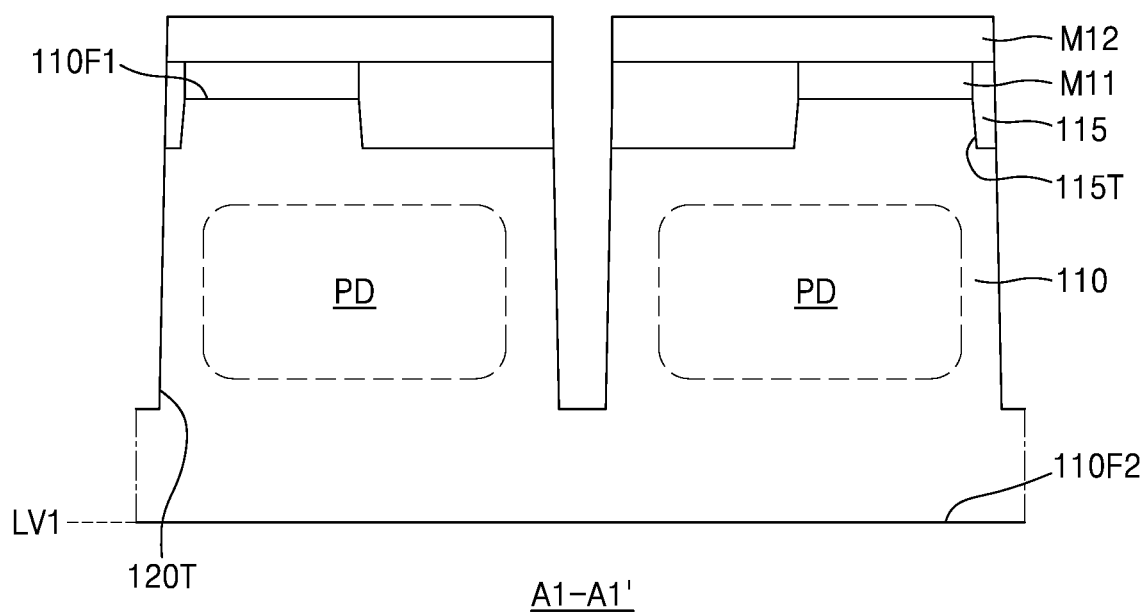

Referring to the embodiment of FIG. 13, by forming an insulating layer on the first mask pattern M11 and inside the element isolation trench 115T, and planarizing an upper portion of the insulating layer so that the upper surface of the first mask pattern M11 is exposed, the element isolation layer 115 may be formed inside the element isolation trench 115T.

In an embodiment, the element isolation layer 115 may include the first insulating layer conformally formed on an inner wall of the element isolation trench 115T and the second insulating layer on the first insulating layer, filling an internal space of the element isolation trench 115T.

In other embodiments, unlike as illustrated in FIG. 13, the element isolation layer 115 may also be arranged on an upper surface of the first mask pattern M11 and cover the upper surface of the first mask pattern M11.

Referring to the embodiment of FIG. 13, a second mask pattern M12 may be formed on the first surface 110F1 of the semiconductor substrate 110, and the pixel trench 120T may be formed in the semiconductor substrate 110 by using the second mask pattern M12 as an etch mask. The pixel trench 120T may have a certain depth from the first surface 110F1 of the semiconductor substrate 110, and may be formed in a matrix form in a plan view.

Figure 14:
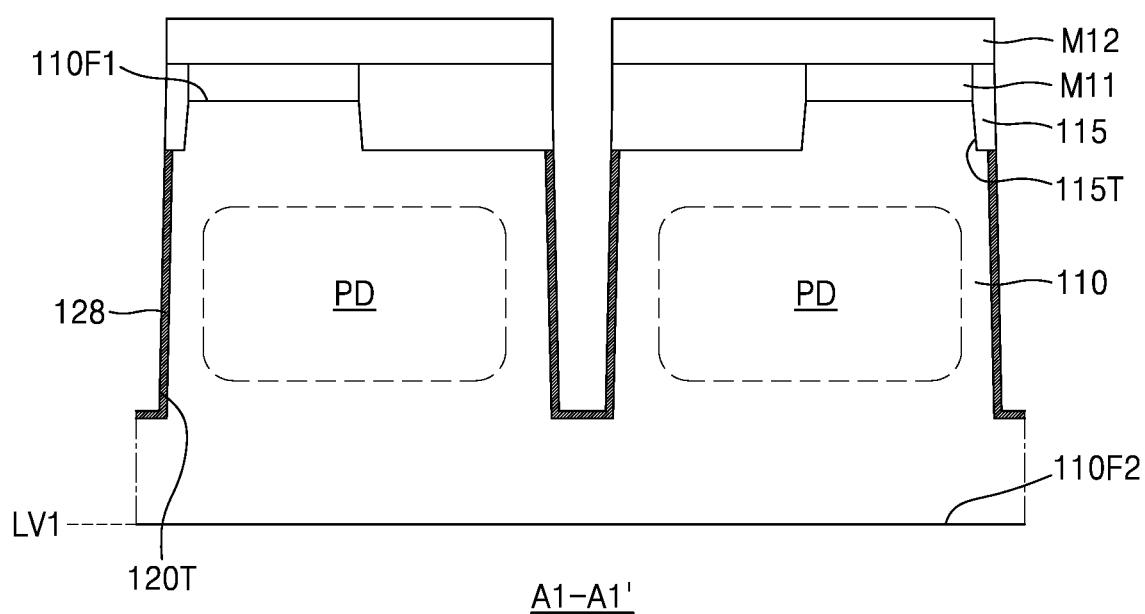

Referring to the embodiment of FIG. 14, the barrier impurity region 128 may be formed by implanting a p-type impurity into an internal region of the semiconductor substrate 110 exposed by the pixel trench 120T. For example, in an etching process for forming the pixel trench 120T, a surface defect such as a dangling bond on a side wall of the pixel trench 120T may occur, and the barrier impurity region 128 may prevent the dark current from occurring due to such a surface defect.

In some embodiments, the barrier impurity region 128 may be formed by performing an ion implantation process on an internal wall of the pixel trench 120T.

In other embodiments, the barrier impurity region 128 may be formed, by forming an impurity doping layer including a p-type impurity on the internal wall of the pixel trench 120T, and diffusing the p-type impurity in the impurity doping layer to the internal portion of the semiconductor substrate 110 exposed to the internal wall of the pixel trench 120T. Thereafter, the impurity doping layer may be removed.

Figure 15:
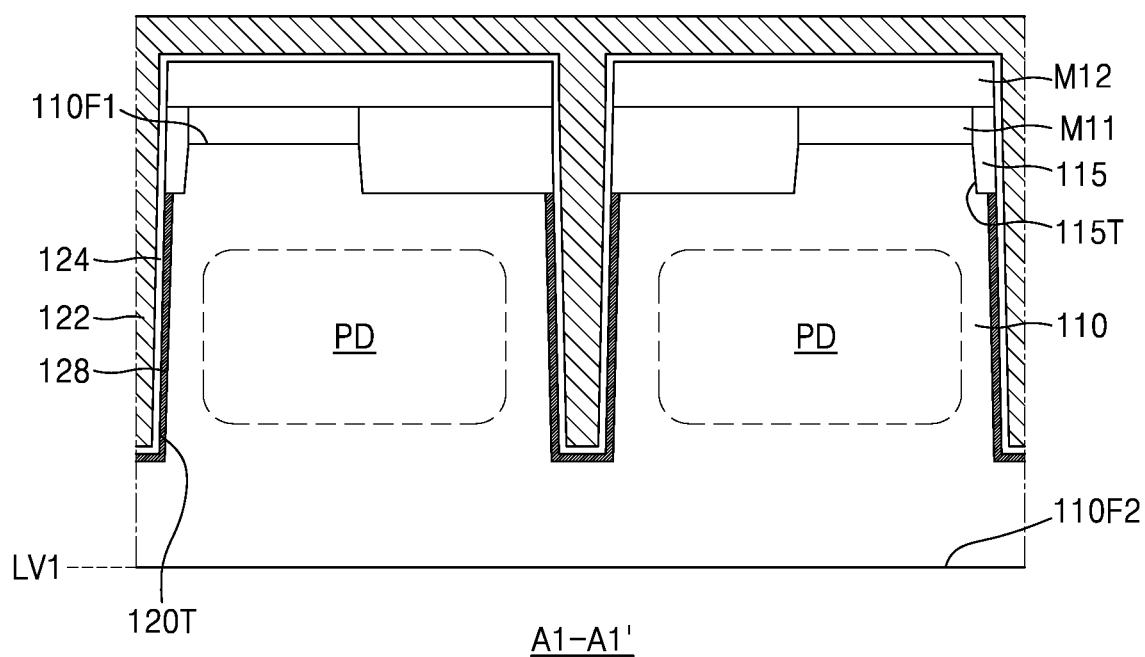

Referring to the embodiment of FIG. 15, the insulating liner 124 may be conformally formed by using a chemical vapor deposition (CVD) process or an atomic layer deposition (ALD) process on the second mask pattern M12 and internal wall of the pixel trench 120T.

Thereafter, the conductive layer 122 filling the internal wall of the pixel trench 120T may be formed on the insulating liner 124. In an embodiment, the conductive layer 122 may include at least one material selected from doped polysilicon, a metal, metal silicide, metal nitride, and a metal-including layer. However, embodiments of the present inventive concept are not limited thereto.

Figure 16:
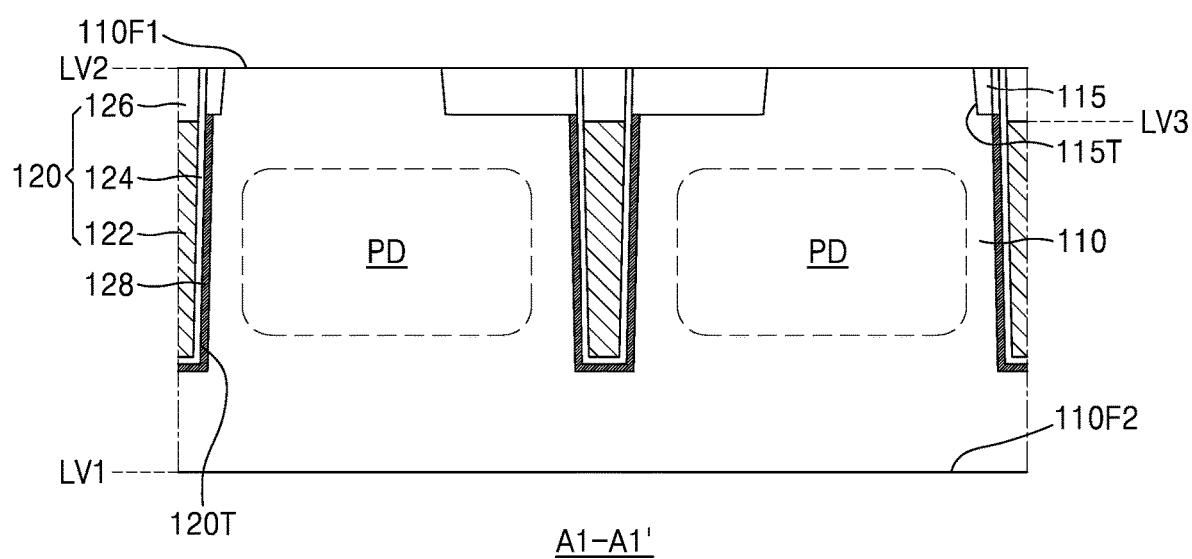

Referring to the embodiment of FIG. 16, an upper portion of the conductive layer 122 may be removed by using an etch back process, or the like until an upper surface of the conductive layer 122 reaches a third vertical level LV3 that is lower than the upper surface of the first surface 110F1 of the semiconductor substrate 110.

Thereafter, in an embodiment, the upper insulating layer 126 may remain inside the entrance of the pixel trench 120T, by filling the insulating layer to fill the entrance of the pixel trench 120T on the second mask pattern M12, and removing the insulating layer, the first mask pattern M11, and the second mask pattern M12 until the first surface 110F1 of the semiconductor substrate 110 is exposed.

Figure 17A:
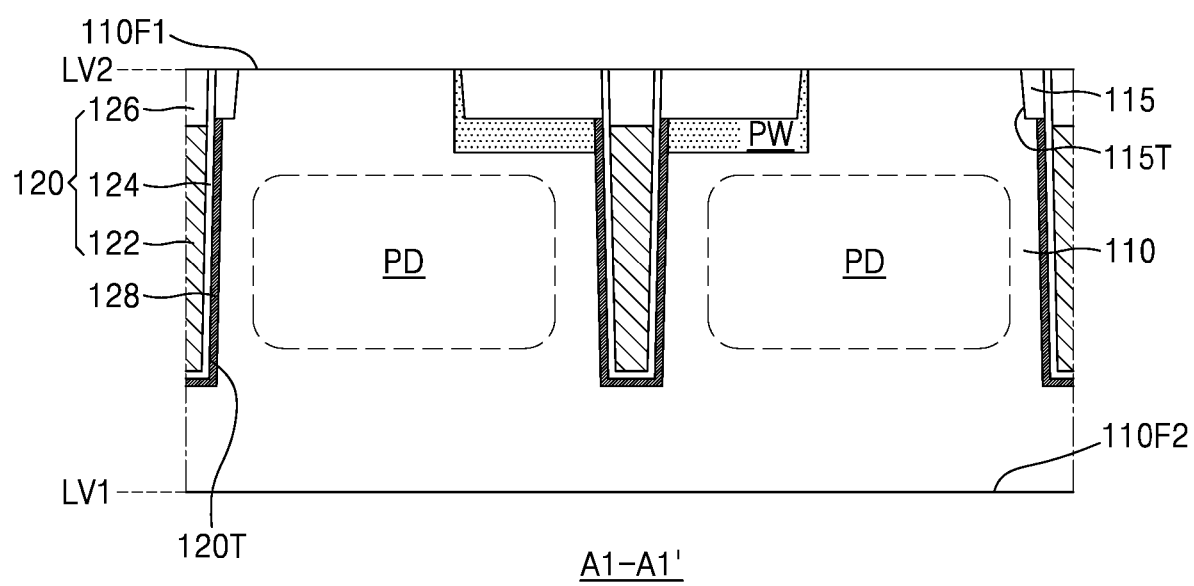
Figure 17B:
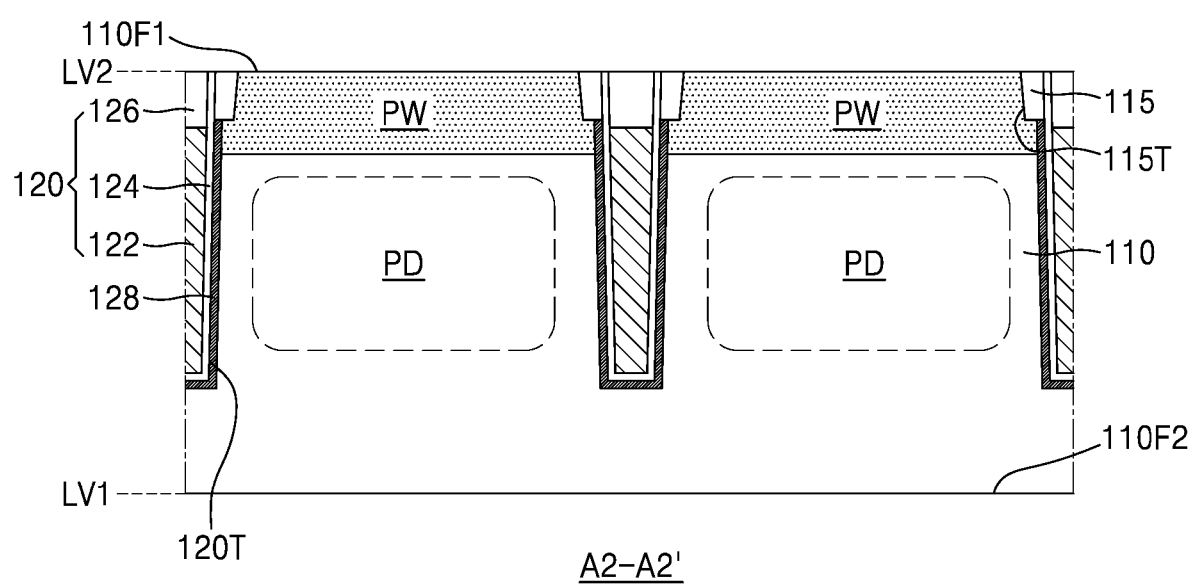
FIGS. 17B and 20B are cross-sectional views illustrating a manufacturing method of an image sensor taken along line A2-A2' in FIG. 2 according to embodiments of the present inventive concept.

Referring to the embodiments of FIGS. 17A and 17B, the p-well region PW may be formed, by forming a mask pattern on the first surface 110F1 of the semiconductor substrate 110, and implanting p-type impurity ions into the internal portion of the semiconductor substrate 110. On the other hand, a portion of the p-well region PW may be formed inside the semiconductor substrate 110 under the element isolation layer 115.

Figure 18:
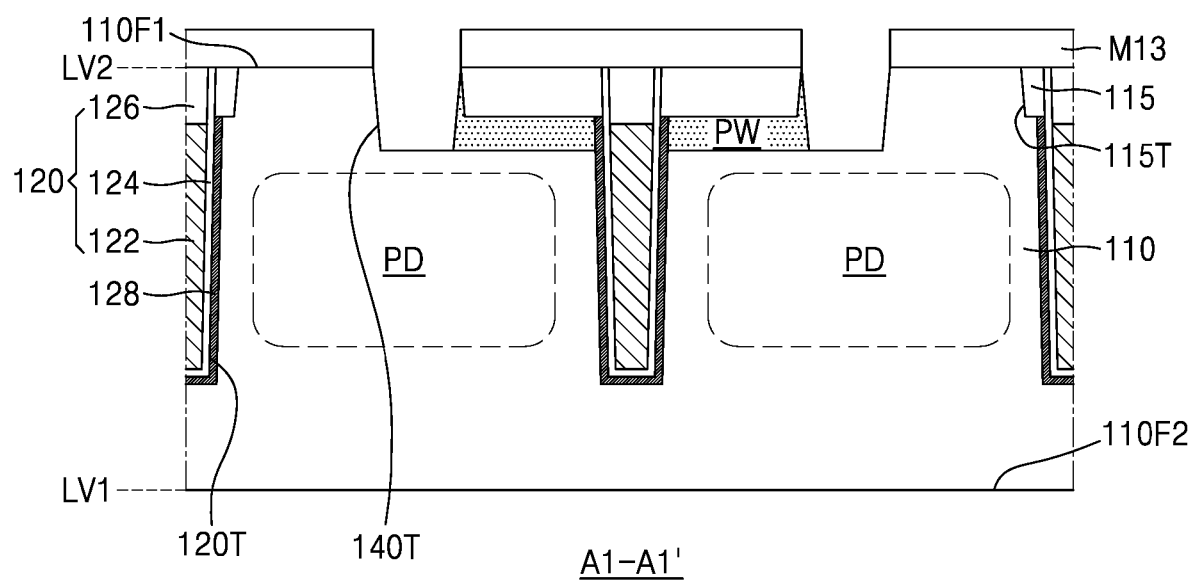

Referring to the embodiment of FIG. 18, the transmission gate trench 140T may be formed, by forming a third mask pattern M13 on the first surface 110F1 of the semiconductor substrate 110, and removing a portion of the semiconductor substrate 110 by using the third mask pattern M13 as an etch mask.

Figure 19:
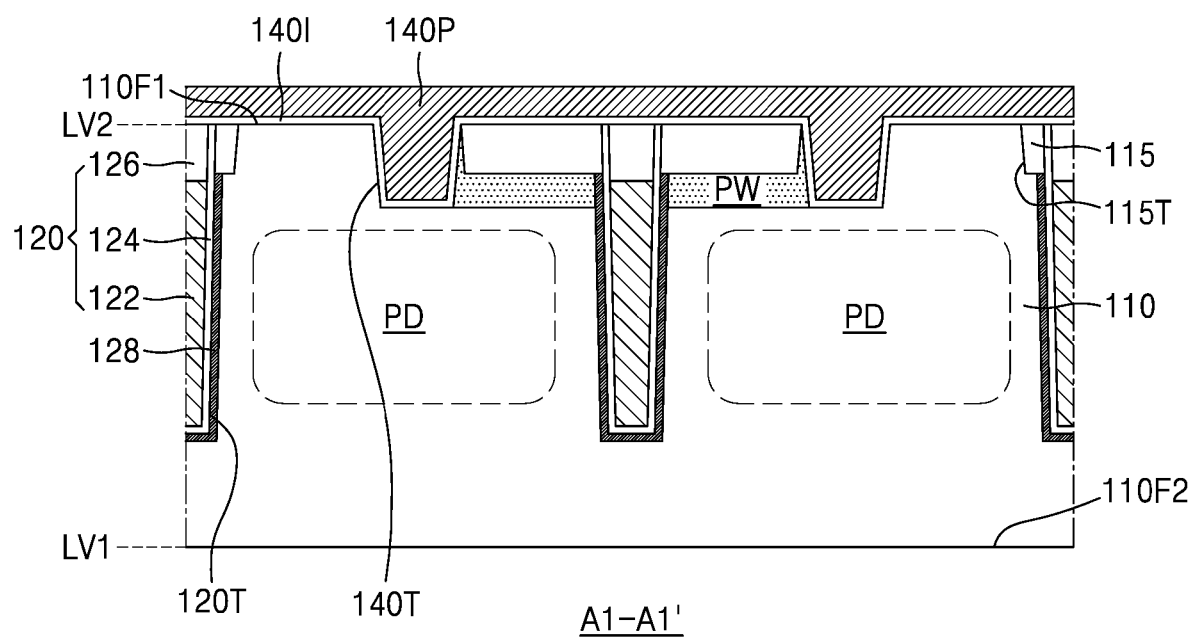

Referring to the embodiment of FIG. 19, the buried transmission gate insulating layer 140I may be conformally formed on the first surface 110F1 of the semiconductor substrate 110 and on the internal wall of the transmission gate trench 140T.

Thereafter, a conductive layer 140P filling the transmission gate trench 140T may be formed on the buried transmission gate insulating layer 140I. The conductive layer 140P may entirely fill the transmission gate trench 140T, while being formed with a sufficiently large thickness to form the planar gate electrodes 150 (refer to FIG. 20B) on the first surface 110F1 of the semiconductor substrate 110. In an embodiment, the conductive layer 140P may be formed by using at least one material selected from doped polysilicon, a metal, a metal silicide, a metal nitride, and a metal-including layer. However, embodiments of the present inventive concept are not limited thereto.

Figure 20A:
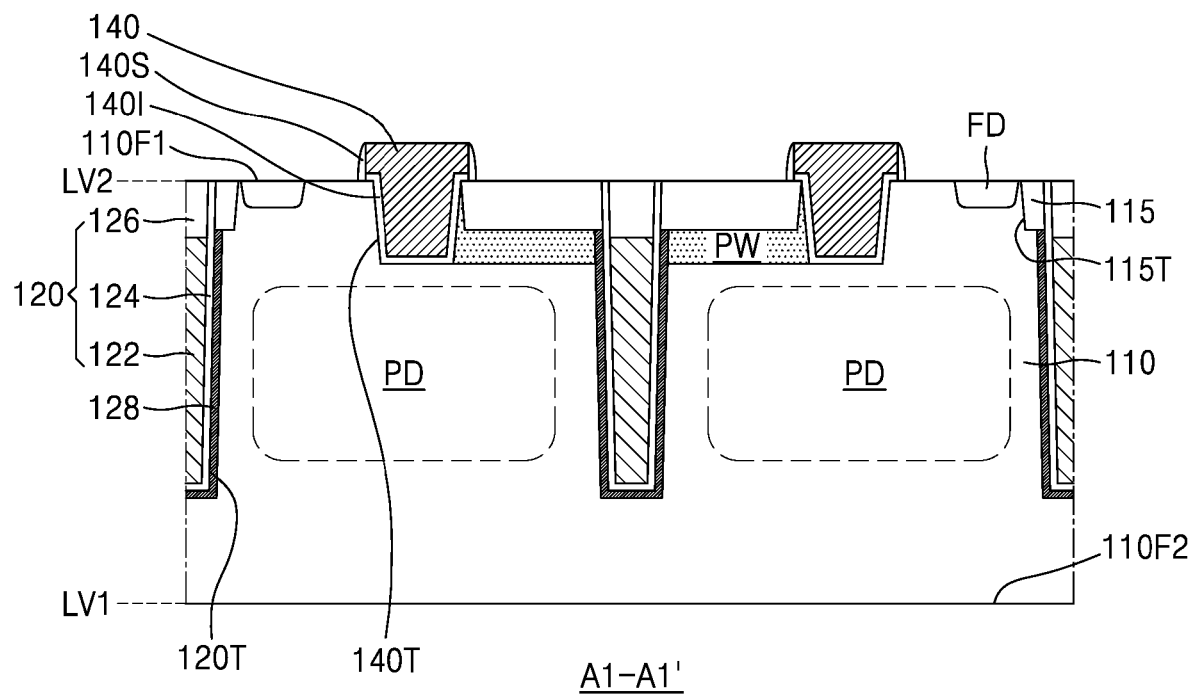
Figure 20B:
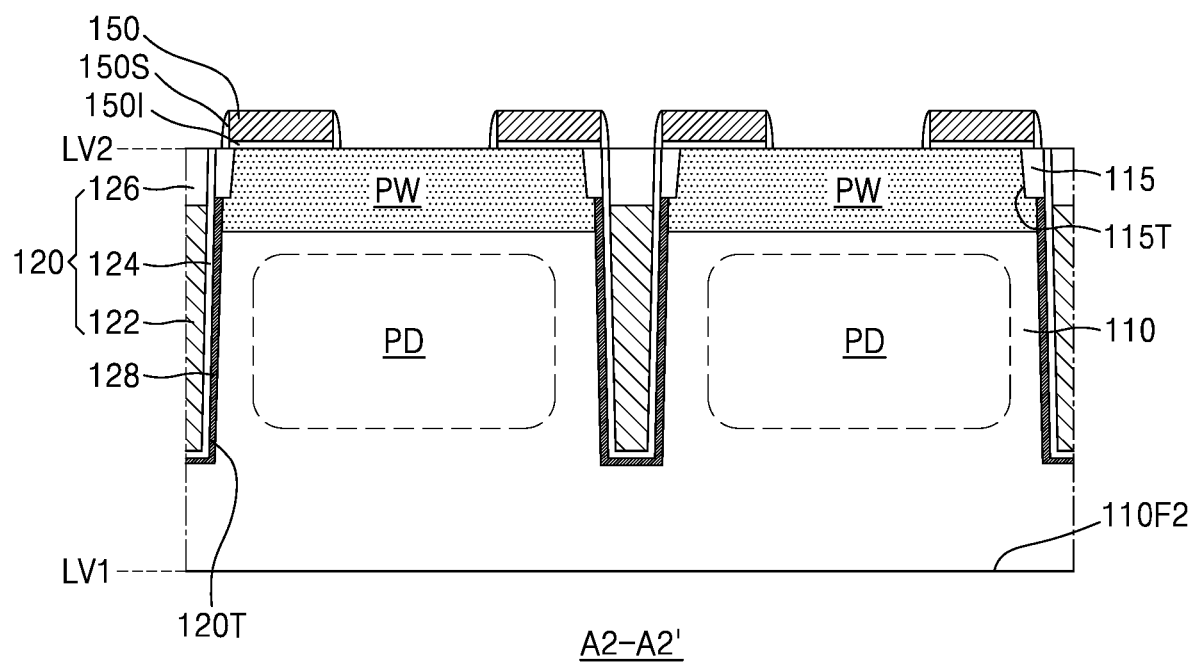

Referring to FIGS. 20A and 20B, the buried transmission gate electrode 140 and the planar gate electrodes 150 may be formed, by forming a mask pattern on the conductive layer 140P, and patterning the conductive layer 140P.

On the other hand, a portion of the buried transmission gate insulating layer 140I arranged on the first surface 110F1 of the semiconductor substrate 110 may be removed except for a portion covered by the planar gate electrodes 150. Accordingly, the gate electrode 150 may be formed under the planar gate electrodes 150.

Thereafter, the transmission gate spacer 140S and the gate spacer 150S (refer to FIG. 4) may be formed on the side walls of the buried transmission gate electrode 140 and the planar gate electrodes 150, respectively. In an embodiment, an insulating layer covering the buried transmission gate electrode 140 and the planar gate electrodes 150 may be formed, then an anisotropic etching process may be performed on the insulating layer to form the transmission gate spacer 140S and the gate electrode 150 on the side walls of the buried transmission gate electrode 140 and the planar gate electrodes 150, respectively.

Thereafter, the floating diffusion region FD may be formed by performing the ion implantation process to some region of the first surface 110F1 of the semiconductor substrate 110.

Figure 21:
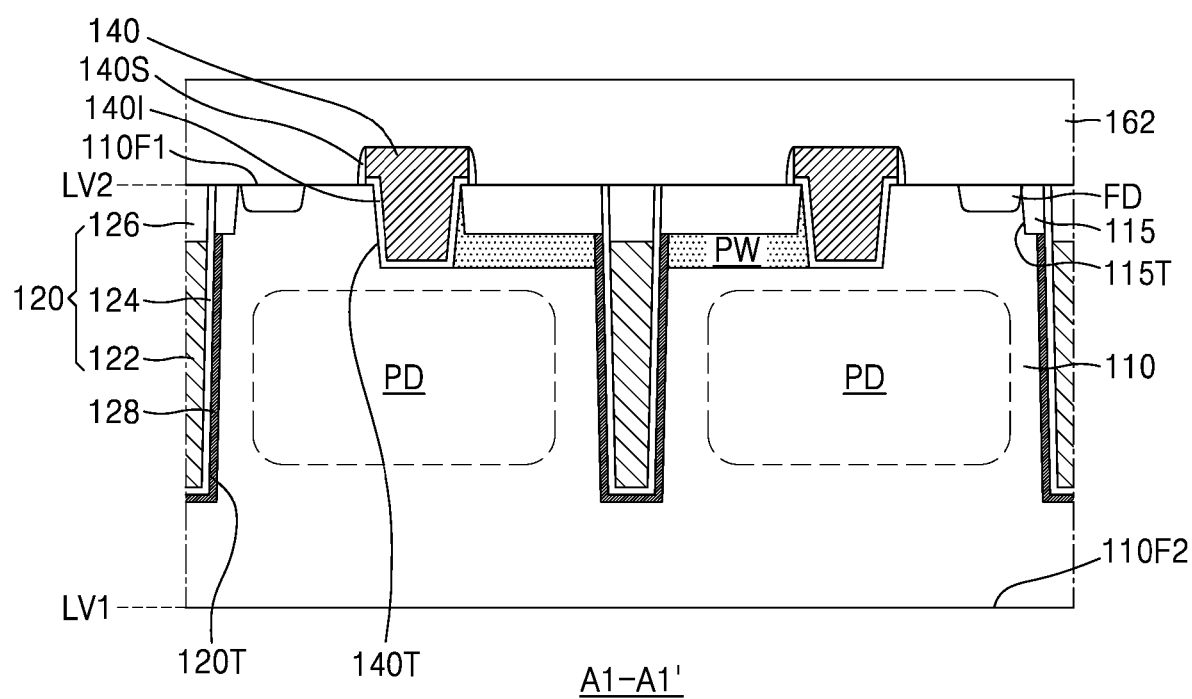

Referring to the embodiment of FIG. 21, the interlayer insulating layer 162 may be formed on the first surface 110F1 of the semiconductor substrate 110. In an embodiment, the interlayer insulating layer 162 may be formed to cover with a sufficient height the buried transmission gate electrode 140 and the planar gate electrodes 150.

In an embodiment, before the interlayer insulating layer 162 is formed, the etching stop layer conformally covering the buried transmission gate electrode 140 and the planar gate electrodes 150 on the first surface 110F1 of the semiconductor substrate 110 may be further formed.

Figure 22:
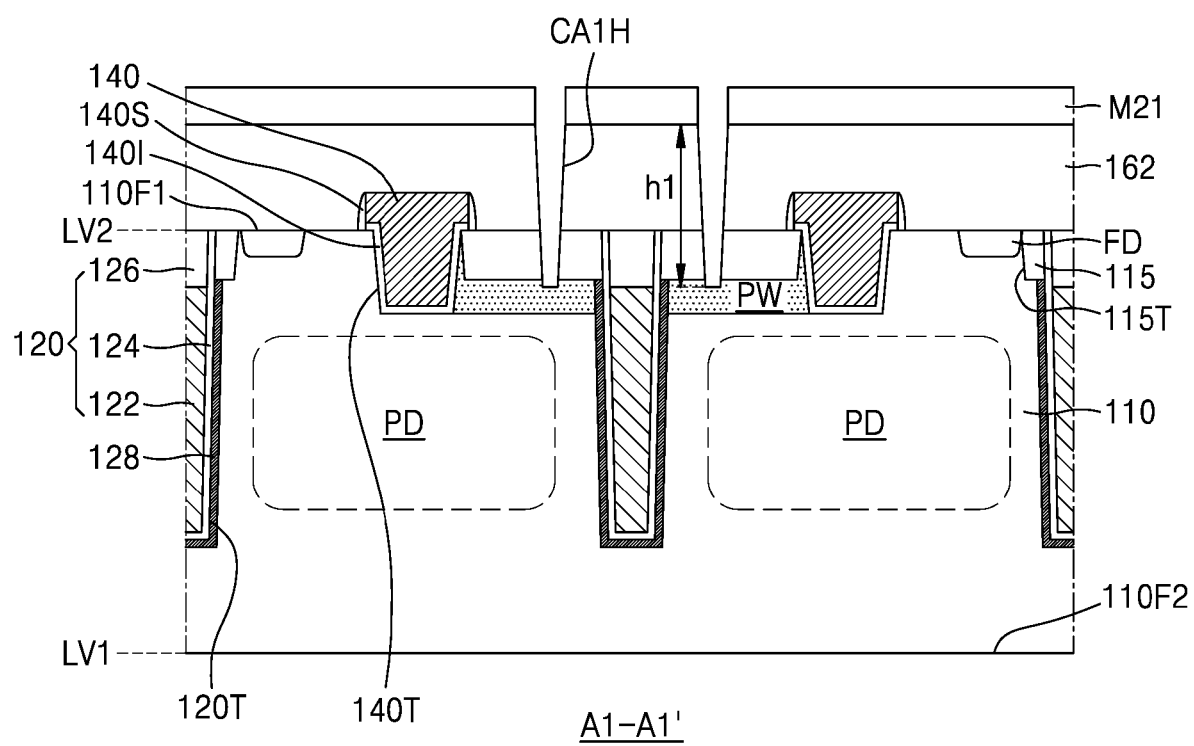

Referring to the embodiment of FIG. 22, a fourth mask pattern M21 may be formed on the interlayer insulating layer 162, and the first contact hole CA1H penetrating the interlayer insulating layer 162 and the element isolation layer 115 may be formed by using the fourth mask pattern M21 as the etch mask.

In an embodiment, the first contact hole CA1H may extend to a lower level than the bottom surface of the element isolation layer 115, and the p-well region PW may be exposed to a bottom portion of the first contact hole CA1H.

Figure 23:
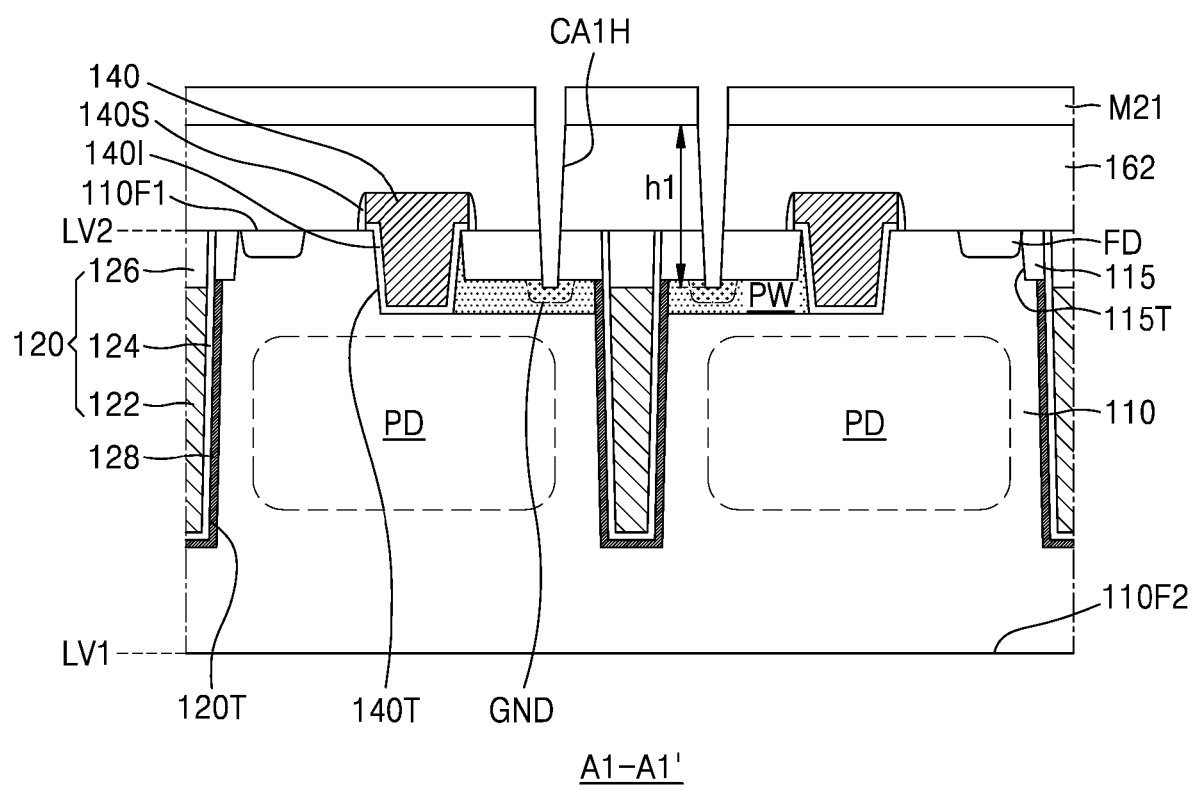

Referring to the embodiment of FIG. 23, the ground region GND may be formed by implanting a p-type impurity into the inside of the p-well region PW exposed via the first contact hole CA1H. The ground region GND may include a region having a higher impurity concentration than the p-well region PW.

In other embodiments, a process of implanting a p-type impurity via the first contact hole CA1H to form the ground region GND may be omitted.

Thereafter, the fourth mask pattern M21 may be removed.

Figure 24:
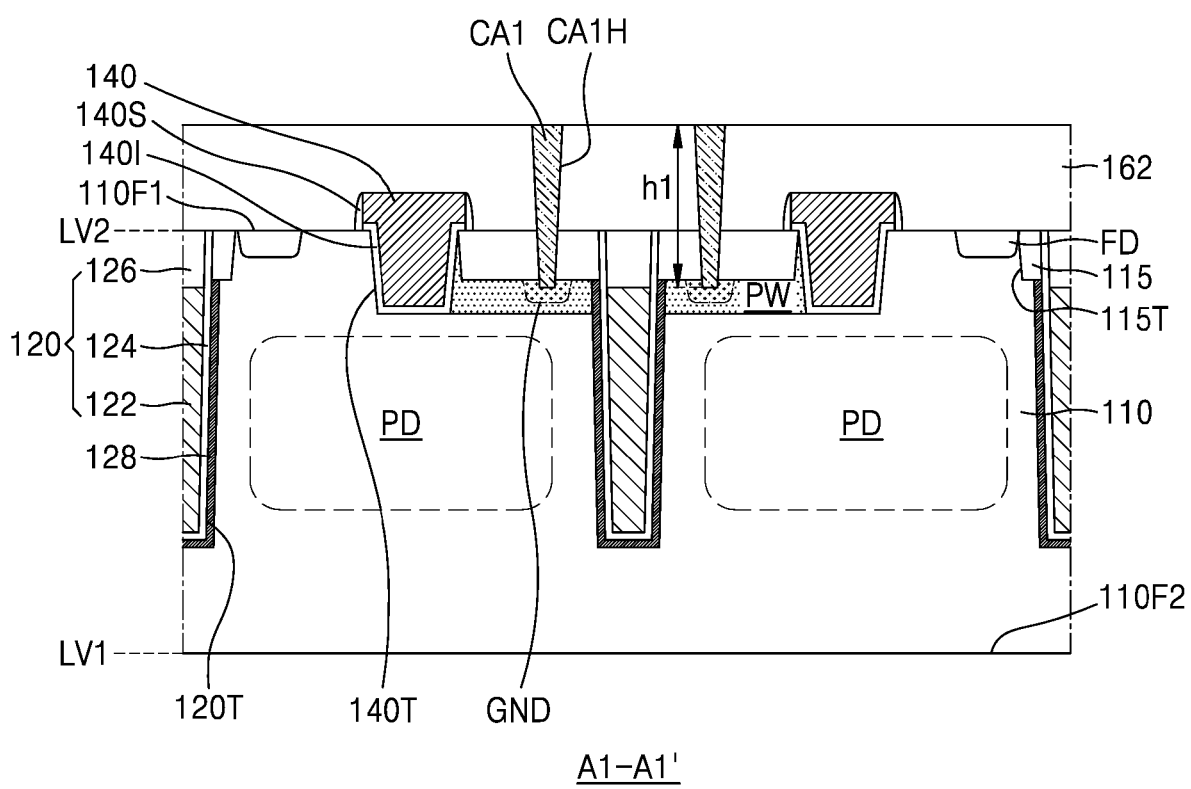

Referring to the embodiment of FIG. 24, by forming a conductive layer filling the first contact hole CA1H on the interlayer insulating layer 162, and planarizing an upper side of the conductive layer until an upper surface of the interlayer insulating layer 162 is exposed, the ground contact CA1 may be formed inside the first contact hole CA1H.

Figure 25:
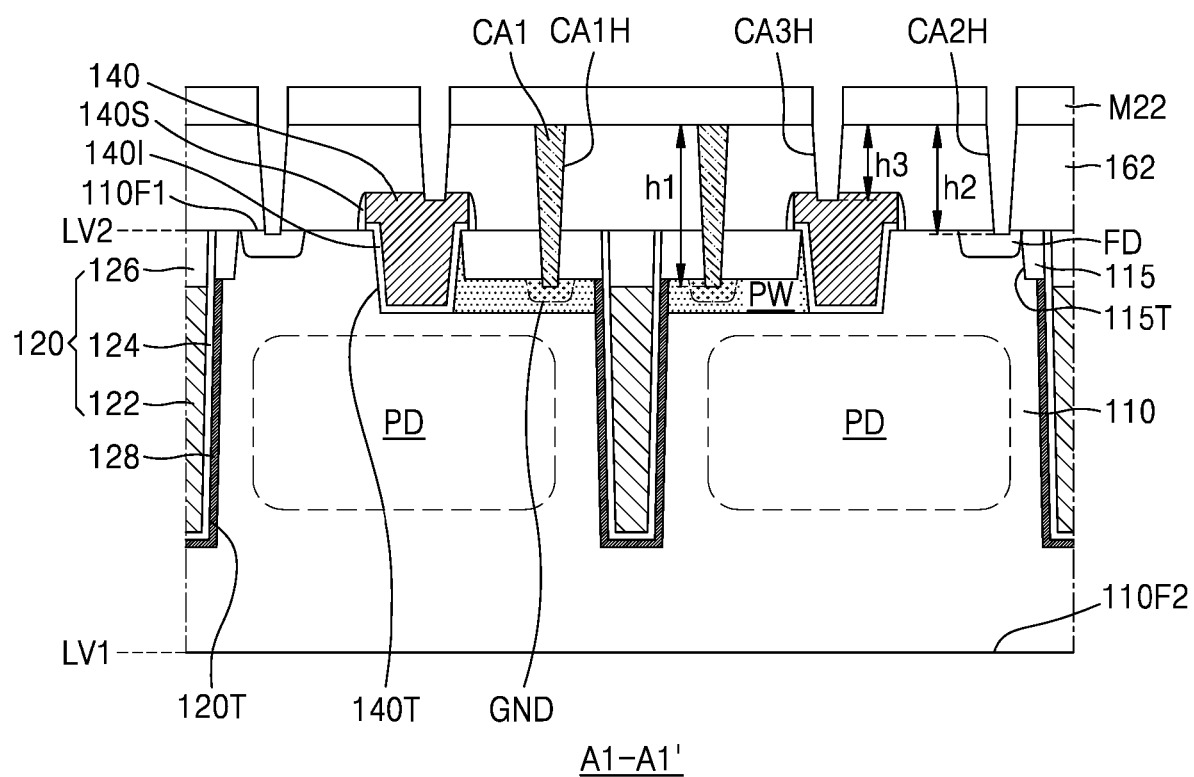

Referring to the embodiment of FIG. 25, after forming a fifth mask pattern M22 on the interlayer insulating layer 162, the second contact hole CA2H and the third contact hole CA3H penetrating the interlayer insulating layer 162 may be formed by using the fifth mask pattern M22 as an etch mask.

In an embodiment, the second contact hole CA2H may expose the first surface 110F1 of the semiconductor substrate 110, and the third contact hole CA3H may expose the upper surface of the buried transmission gate electrode 140 and the upper surface of the planar gate electrode 150 (FIG. 20B).

Figure 26:
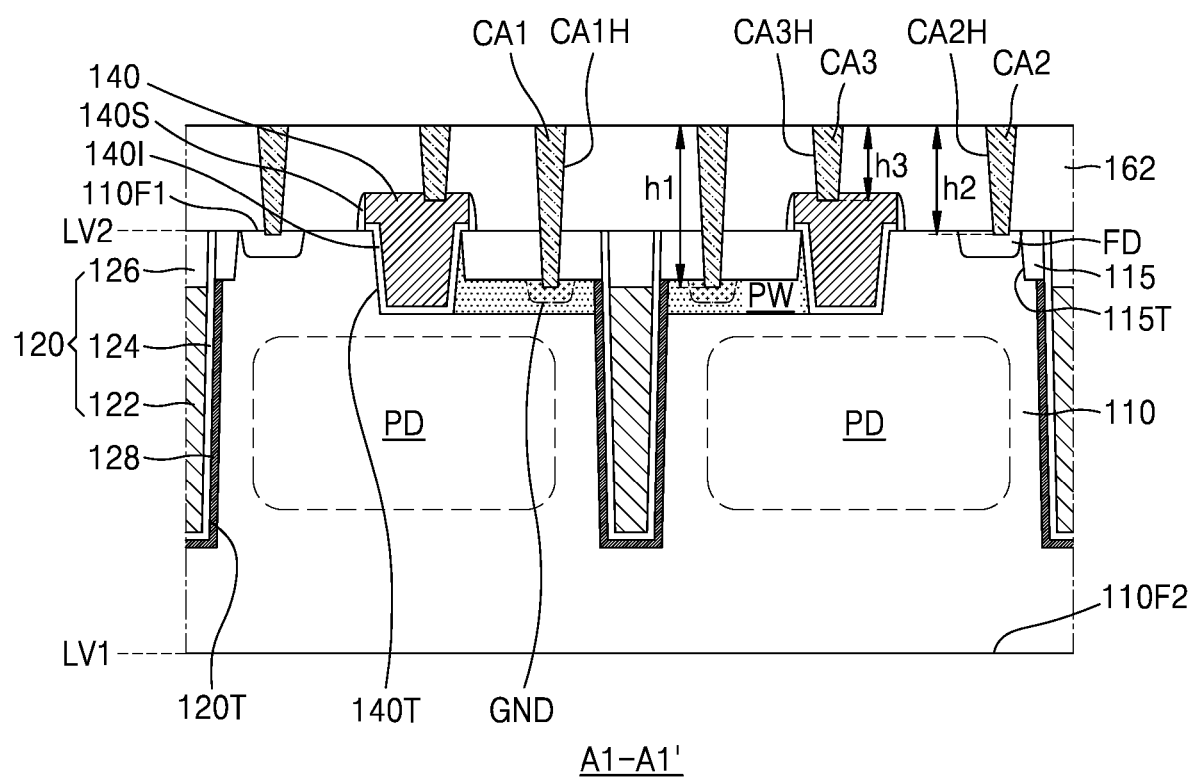

Referring to the embodiment of FIG. 26, a conductive layer may be formed on the interlayer insulating layer 162 to fill the second contact hole CA2H and the third contact hole CA3H, then an upper side of the conductive layer may be planarized until the upper surface of the interlayer insulating layer 162 is exposed, thereby forming the active contact CA2 inside the second contact hole CA2H and forming the gate contact CA3 inside the third contact hole CA3H.

Figure 27:
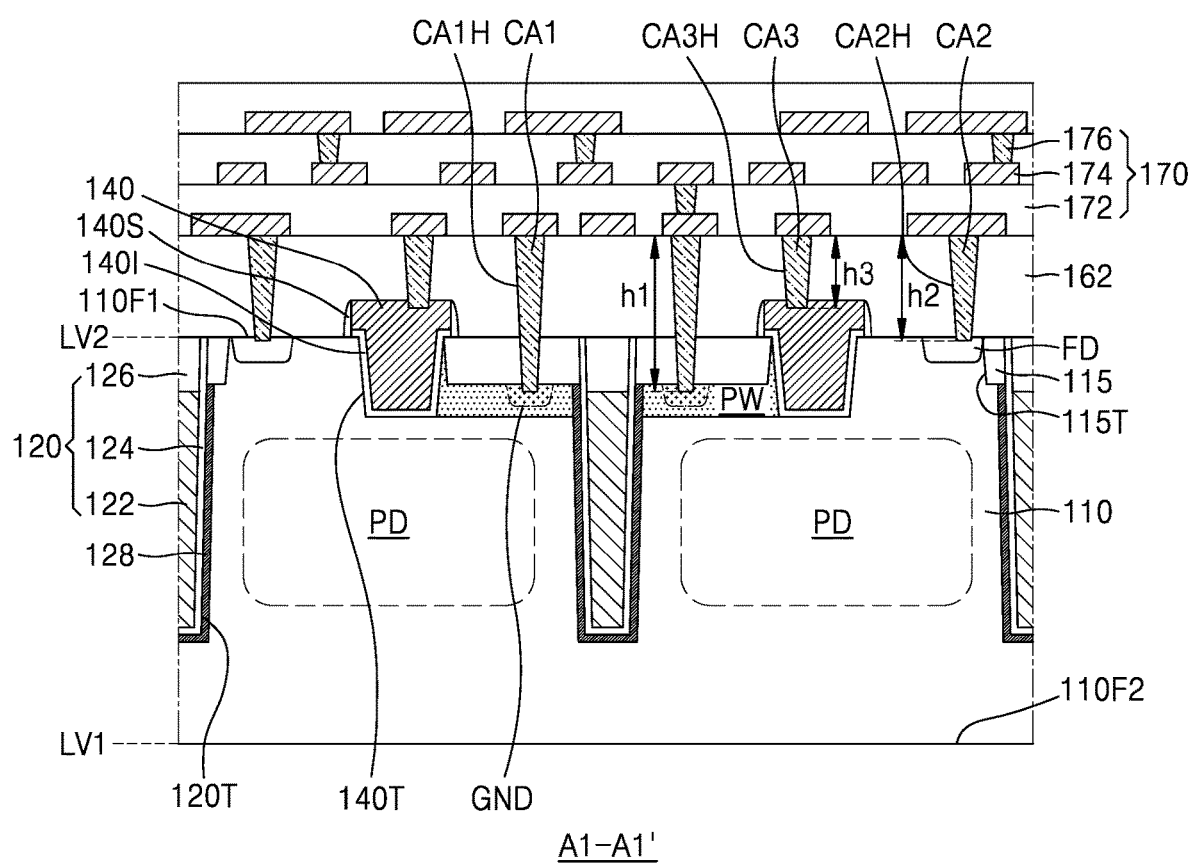

Referring to the embodiment of FIG. 27, by forming a conductive layer on the interlayer insulating layer 162 and patterning the conductive layer, and repeatedly performing operations of forming the conductive layer to cover the patterned conductive layer, the upper wiring structure 170 including the insulating layer 172, the wiring layer 174, and the via contact 176 may be formed.

Figure 28:
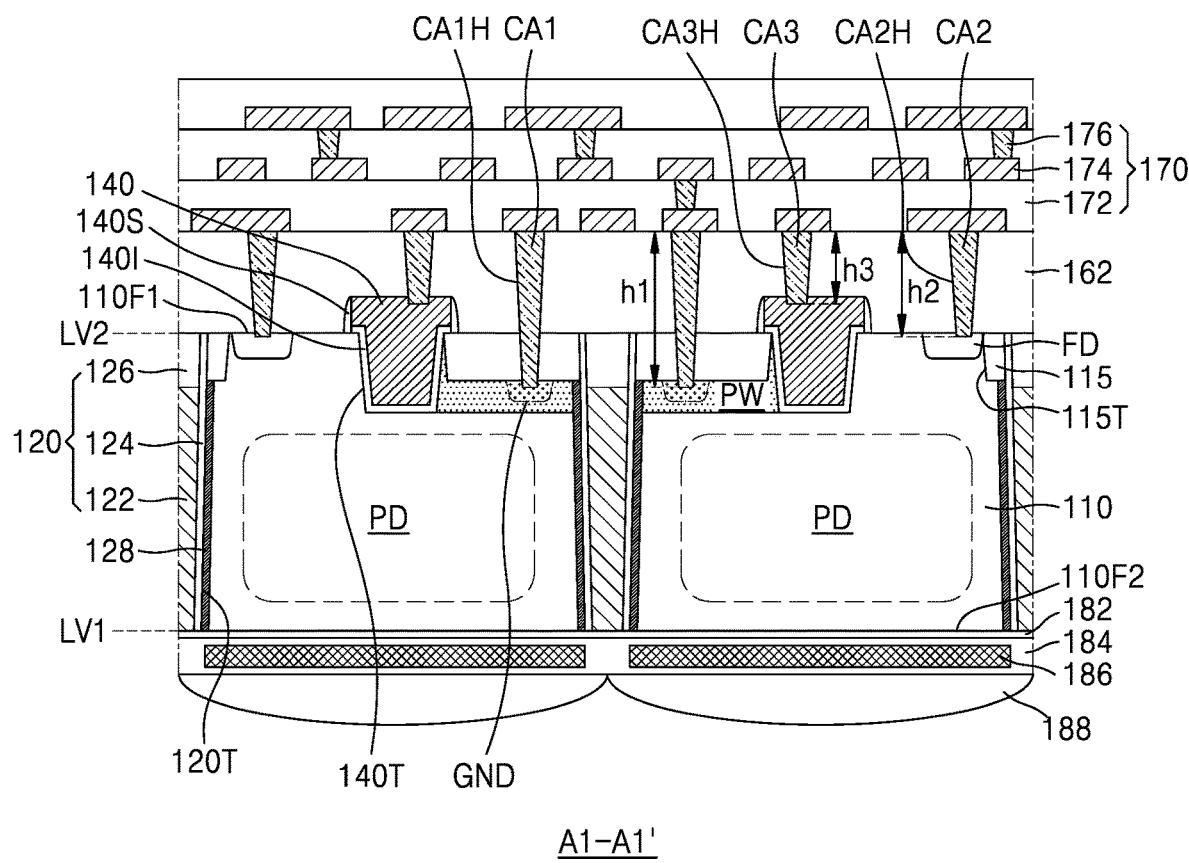

Referring to FIGS. 28 and 5 together, after a support substrate is adhered to the first surface 110F1 of the semiconductor substrate 110, the semiconductor substrate 110 may be overturned so that the second surface 110F2 of the semiconductor substrate 110 faces upward.

Thereafter, a portion of the semiconductor substrate 110 may be removed from the second surface 110F2 of the semiconductor substrate 110 by performing the planarization process, for example, a CMP process or an etch back process, until the upper surface of the pixel separation structure 120 (e.g., an end portion thereof adjacent to the second surface 110F2 of the semiconductor substrate 110) is exposed. When the removal process is performed, a reference level of the second surface 110F2 of the semiconductor substrate 110 may be lowered.

Thereafter, the back side insulating layer 182 may be formed on the second surface 110F2 of the semiconductor substrate 110. The back side insulating layer 182 may cover the pixel separation structure 120 and be formed on the entire region of the second surface 110F2 of the semiconductor substrate 110.

Thereafter, in the optical black pixel OBP, the back side contact hole BCT may be formed by removing some thickness from the second surface 110F2 of the semiconductor substrate 110. The back side contact hole BCT may be formed to be interconnected to the pixel trench 120T.

The barrier conductive layer 192 may be formed on the internal wall of the back side contact hole BCT, and the light shield layer 196 may be formed to cover the entire upper surface of the optical black pixel OBP. In an embodiment, the barrier conductive layer 192 and the light shield layer 196 may be simultaneously formed by using the same material. However, embodiments of the present inventive concept are not limited thereto. Thereafter, the buried conductive layer 194 filling the inside of the back side contact hole BCT may be formed.

Thereafter, the passivation layer 184 may be formed on the back side insulating layer 182, and the color filter 186 and the microlens 188 may be formed on the passivation layer 184.

The image sensor 100 may be completed by using the above-described processes.

In general, in comparative embodiments, a ground region may be formed to be surrounded by the element isolation layer 115 at the same level as the first surface 110F1 of the semiconductor substrate 110, and the ground region may be arranged apart from the active region ACT in the horizontal direction with the element isolation layer 115 therebetween. Accordingly, in the patterning process for forming the element isolation layer 115 having such shape, it may be necessary to form a mask pattern corresponding to the active region ACT and a mask pattern corresponding to the ground region. There may be an issue that a lifting defect occurs in the patterning process because a size of the mask pattern corresponding to the ground region is less than a size of the mask pattern corresponding to the active region ACT. When the mask pattern corresponding to the ground region is formed relatively large to prevent the lifting defect, an area occupied by the ground region may be increased and may limit pixel miniaturization.

However, according to the above-described embodiments of the present inventive concept, the ground region GND may be formed inside the p-well region PW under the element isolation layer 115, and the ground contact CA1 may be arranged to penetrate the element isolation layer 115 and be connected to the ground region GND. Thus, a mask pattern corresponding to a ground region may not need to be formed, and thus, a lifting defect of a mask pattern may be prevented. In addition, when the ground region GND is arranged under the element isolation layer 115, an area of the ground region GND may be reduced, and the pixel PX of the image sensor 100 may have a compact size.

Figure 29:
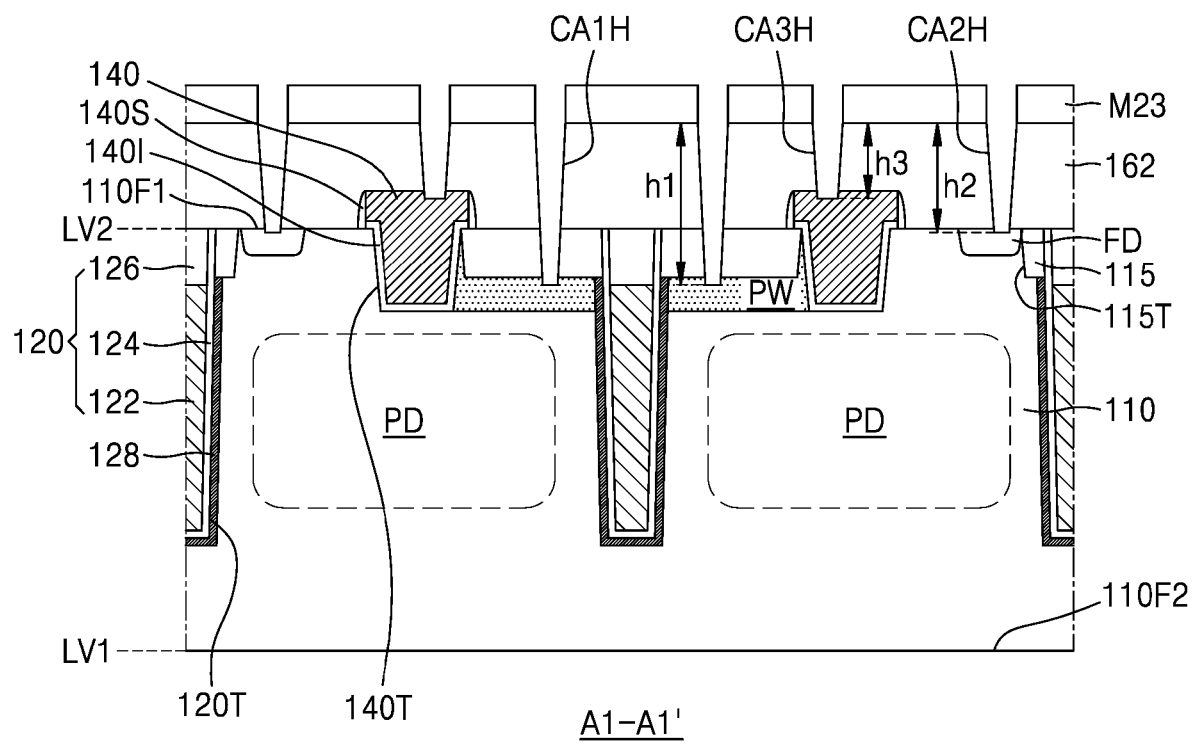
FIGS. 29 and 30 are cross-sectional views illustrating a manufacturing method of an image sensor taken along line A1-A1' in FIG. 2 according to embodiments of the present inventive concept.
Figure 30:
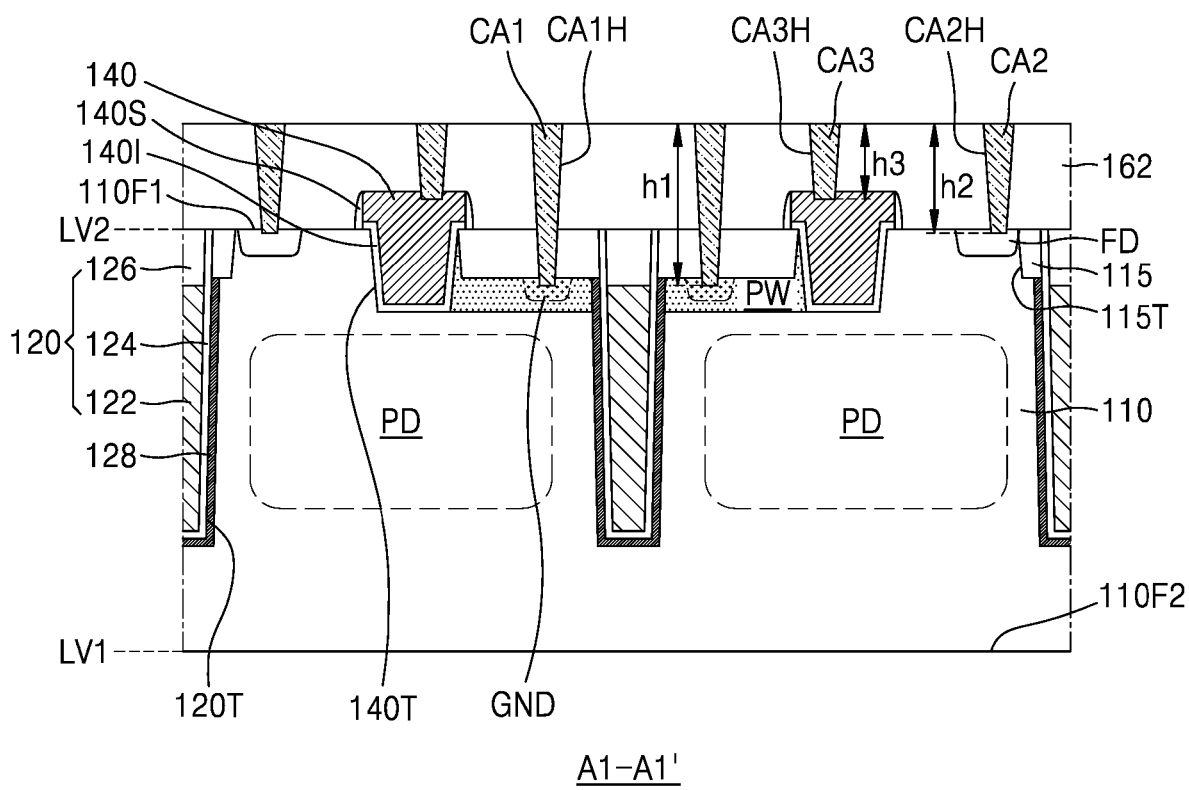

FIGS. 29 and 30 are cross-sectional views illustrating a manufacturing method of the image sensor 100, according to embodiments of the present inventive concept.

First, by performing processes described with reference to FIGS. 12 through 21, a structure may be formed that includes the interlayer insulating layer 162.

Referring to FIG. 29, a mask pattern M23 may be formed on the interlayer insulating layer 162, and by using the mask pattern M23 as an etch mask, the first contact hole CA1H, the second contact hole CA2H, and the third contact hole CA3H penetrating the interlayer insulating layer 162 may be formed.

Thereafter, the first contact hole CA1H may be additionally etched to further penetrate the element isolation layer 115 and expose the upper surface of the p-well region PW, and may be expanded downward. In an embodiment, the first contact hole CA1H may be formed to have the first height h1 that is greater than the second height h2 of the second contact hole CA2H and the third height h3 of the third contact hole CA3H.

In an embodiment, processes of forming the first, second, and third contact holes CA1H, CA2H, and CA3H may be performed in an etch atmosphere by using an etchant having an etch selectivity. For example, while the element isolation layer 115 is removed on the bottom portion of the first contact hole CA1H, an etch amount of the semiconductor substrate 110 exposed to the bottom portion of the second contact hole CA2H, and an etch amount of the bottom portion and the planar gate electrodes 150 exposed to the bottom portion of the third contact hole CA3H may be small.

Referring to the embodiment of FIG. 30, a conductive layer filling the first, second, and third contact holes CA1H, CA2H, and CA3H may be formed on the interlayer insulating layer 162, and the ground contact CA1, the active contact CA2, and the ground contact CA3 may be formed in the first, second, and third contact holes CA1H, CA2H, and CA3H, respectively, by planarizing upper sides of the conductive layers until the upper surface of the interlayer insulating layer 162 is exposed.

Thereafter, the image sensor 100 may be completed by performing processes described with reference to FIGS. 27 and 28.

Figure 31:
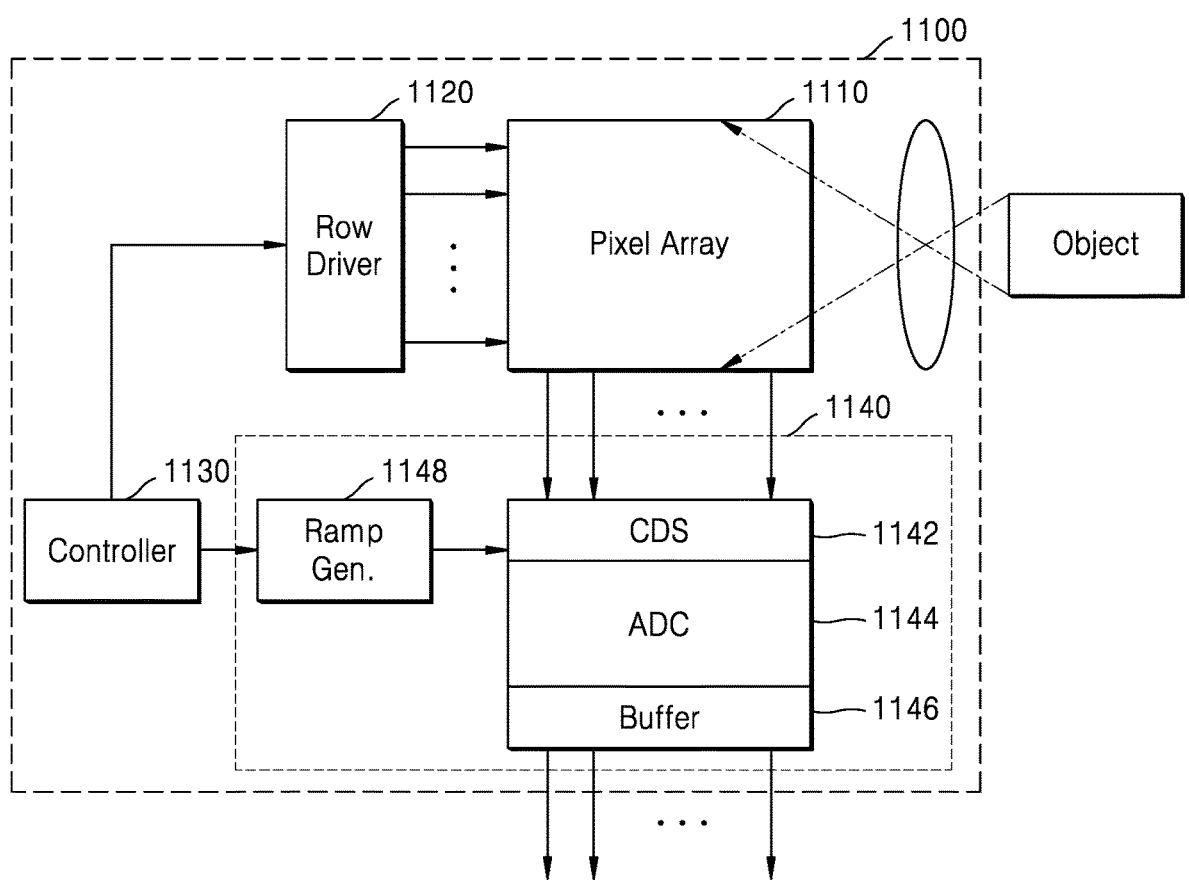
FIG. 31 is a block diagram illustrating a configuration of an image sensor, according to an embodiment.

FIG. 31 is a block diagram illustrating a configuration of an image sensor 1100, according to an embodiment.

Referring to FIG. 31, the image sensor 1100 may include a pixel array 1110, a controller 1130, a row driver 1120, and a pixel signal processor 1140. The image sensor 1100 may include at least one of the image sensors 100, 100A, 100B, 100C, and 200 described with reference to the embodiments of FIGS. 1 through 11.

The pixel array 1110 may include a plurality of unit pixels PX arranged two-dimensionally, and each unit pixel PX may include a photoelectric conversion device. The photoelectric conversion element may absorb light to generate charges, and an electrical signal (e.g., an output voltage) according to the generated charges may be provided to the pixel signal processor 1140 via a vertical signal line. The unit pixels PX included in the pixel array 1110 may provide one output voltage at a time in units of rows, and accordingly, the unit pixels PX belonging to one row of the pixel array 1110 may be simultaneously activated by a select signal that is output by the row driver 1120. The unit pixels PX belonging to the selected row may provide the output voltage corresponding to the absorbed light to an output line of a corresponding column.

The controller 1130 may control the row driver 1120 so that the pixel array 1110 absorbs light to accumulate charges, or store temporarily the accumulated charges, and outputs an electrical signal corresponding to the stored charges to the outside of the pixel array 1110. In addition, the controller 1130 may control the pixel signal processor 1140 to measure the output voltage provided by the pixel array 1110.

In an embodiment, the pixel signal processor 1140 may include a correlated double sampler (CDS) 1142, an analog-to-digital converter (ADC) 1144, and a buffer 1146. The CDS 1142 may sample and hold the output voltage provided by the pixel array 1110. The CDS 1142 may double-sample a certain noise level and a level of the generated output voltage, and output a level corresponding to a difference therebetween. In addition, the CDS 1142 may receive ramp signals generated by a ramp signal generator 1148, compare the ramp signals to each other, and output a result of comparison.

The ADC 1144 may convert an analog signal corresponding to the level received from the CDS 1142 to a digital signal. The buffer 1146 may latch the digital signals, and the latched digital signals may be sequentially output to the outside of the image sensor 1100 and transferred to an image processor.

While the present inventive concept has been particularly shown and described with reference to embodiments thereof, it will be understood that various changes in form and details may be made therein without departing from the spirit and scope of the present inventive concept.

What is claimed is:

1. An image sensor comprising:
  a semiconductor substrate comprising a first surface and a second surface, the first surface including an element isolation trench;
  an element isolation layer arranged inside the element isolation trench, the element isolation layer defining an active region;
  a gate electrode arranged on the first surface of the semiconductor substrate;
  an interlayer insulating layer arranged on the first surface of the semiconductor substrate and covering the gate electrode;
  a ground contact configured to penetrate the element isolation layer and the interlayer insulating layer and contact the semiconductor substrate; and
  a color filter arranged on the second surface of the semiconductor substrate.

2. The image sensor of claim 1, further comprising:
  an active contact configured to penetrate the interlayer insulating layer and contact the first surface of the semiconductor substrate in the active region; and
  a gate contact configured to penetrate the interlayer insulating layer and contact an upper surface of the gate electrode.

3. The image sensor of claim 2, wherein the ground contact has a bottom surface positioned at a lower level than a bottom surface of the active contact.

4. The image sensor of claim 2, wherein:
the ground contact has a first height in a first direction perpendicular to the first surface of the semiconductor substrate; and
the active contact has a second height in the first direction that is less than the first height.

5. The image sensor of claim 4, wherein the first height is in a range of about 100 nm to about 600 nm.

6. The image sensor of claim 1, wherein:
an upper side wall of the ground contact is covered by the interlayer insulating layer; and
a lower side wall of the ground contact is covered by the element isolation layer.

7. The image sensor of claim 1, further comprising:
a p-well region arranged in an inside of the semiconductor substrate adjacent to the first surface of the semiconductor substrate, the p-well region is doped with a p-type impurity doped thereon,
wherein the ground contact is connected to the p-well region.

8. The image sensor of claim 7, further comprising:
a pixel trench extending from the first surface of the semiconductor substrate to an inside of the semiconductor substrate;
a pixel separation structure arranged inside the pixel trench, the pixel separation structure defining pixels in the semiconductor substrate and comprising a conductive layer; and
a barrier impurity region arranged around the pixel separation structure in the semiconductor substrate,
wherein the barrier impurity region is doped with a p-type impurity.

9. The image sensor of claim 8, wherein the barrier impurity region is connected to the p-well region.

10. The image sensor of claim 8, wherein the image sensor is configured to apply a ground voltage to the p-well region via the ground contact.

11. An image sensor comprising:
a semiconductor substrate comprising a first surface and a second surface, the semiconductor substrate including a pixel trench extending from the first surface to an inside of the semiconductor substrate and an element isolation trench arranged in the first surface;
a pixel separation structure arranged inside the pixel trench, the pixel separation structure defining pixels in the semiconductor substrate and comprising a conductive layer;
an element isolation layer arranged inside the element isolation trench, the element isolation layer defining an active region;
a p-well region arranged in the inside of the semiconductor substrate adjacent to the first surface of the semiconductor substrate, the p-well region comprising a p-type impurity doped thereon,
a gate electrode arranged on the first surface of the semiconductor substrate;
an interlayer insulating layer arranged on the first surface of the semiconductor substrate and covering the gate electrode;
a ground contact penetrating the element isolation layer and the interlayer insulating layer and connected to the p-well region; and
a color filter arranged on the second surface of the semiconductor substrate.

12. The image sensor of claim 11, further comprising:
a barrier impurity region arranged around the pixel separation structure,
wherein the barrier impurity region is connected to the p-well region.

13. The image sensor of claim 11, wherein the image sensor is configured to apply a ground voltage to the p-well region via the ground contact.

14. The image sensor of claim 11, wherein:
an upper side wall of the ground contact is covered by the interlayer insulating layer;
a lower side wall of the ground contact is covered by the element isolation layer; and
a bottom surface of the ground contact directly contacts the p-well region.

15. The image sensor of claim 11, further comprising:
an active contact penetrating the interlayer insulating layer and contacting the first surface of the semiconductor substrate in the active region; and
a gate contact penetrating the interlayer insulating layer and contacting an upper surface of the gate electrode.

16. The image sensor of claim 15, wherein:
the ground contact has a first height in a first direction perpendicular to the first surface of the semiconductor substrate;
the active contact has a second height in the first direction that is less than the first height; and
the gate contact has a third height in the first direction that is less than the first height.

17. An image sensor comprising:
a semiconductor substrate comprising a first surface and a second surface, the semiconductor substrate including a pixel trench extending from the first surface to the second surface and an element isolation trench arranged in the first surface of the semiconductor substrate;
a pixel separation structure arranged inside the pixel trench, the pixel separation structure defining pixels in the semiconductor substrate and comprising a conductive layer;
an element isolation layer arranged inside the element isolation trench, the element isolation layer defining an active region;
a p-well region arranged in an inside of the semiconductor substrate adjacent to the first surface of the semiconductor substrate, the p-well region comprising a p-type impurity doped thereon,
a gate electrode arranged on the first surface of the semiconductor substrate;
an interlayer insulating layer arranged on the first surface of the semiconductor substrate and covering the gate electrode;
a first contact penetrating the element isolation layer and the interlayer insulating layer and connected to the p-well region;
a second contact penetrating the interlayer insulating layer and contacting the first surface of the semiconductor substrate;
a third contact penetrating the interlayer insulating layer and contacting an upper surface of the gate electrode; and
a color filter arranged on the second surface of the semiconductor substrate.

18. The image sensor of claim 17, wherein the image sensor is configured to apply a ground voltage to the p-well region via the first contact.

19. The image sensor of claim 17, wherein:
a bottom surface of the first contact is positioned at a lower level than the first surface of the semiconductor substrate;
the first contact has a first height in a first direction perpendicular to the first surface of the semiconductor substrate;
the second contact has a second height in the first direction that is less than the first height; and
the third contact has a third height in the first direction, the third height is less than the first height.

20. The image sensor of claim 19, further comprising:
a barrier impurity region arranged around the pixel separation structure in the semiconductor substrate,
wherein the barrier impurity region is connected to the p-well region.

* * * * *